US010332854B2

(12) United States Patent
Katkar et al.

(10) Patent No.: US 10,332,854 B2
(45) Date of Patent: Jun. 25, 2019

(54) ANCHORING STRUCTURE OF FINE PITCH BVA

(71) Applicant: Invensas Corporation, San Jose, CA (US)

(72) Inventors: Rajesh Katkar, San Jose, CA (US); Gabriel Z. Guevara, San Jose, CA (US); Xuan Li, Santa Clara, CA (US); Cyprian Emeka Uzoh, San Jose, CA (US); Guilian Gao, San Jose, CA (US); Liang Wang, Milpitas, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 15/332,533

(22) Filed: Oct. 24, 2016

(65) Prior Publication Data
US 2017/0117243 A1    Apr. 27, 2017

Related U.S. Application Data

(60) Provisional application No. 62/245,573, filed on Oct. 23, 2015.

(51) Int. Cl.
*H01L 23/00* (2006.01)
*H01L 23/31* (2006.01)
(Continued)

(52) U.S. Cl.
CPC .......... *H01L 24/16* (2013.01); *H01L 21/565* (2013.01); *H01L 23/315* (2013.01); *H01L 24/27* (2013.01);
(Continued)

(58) Field of Classification Search
CPC ......... H01L 23/535; H01L 2224/06051; H01L 2224/04042; H01L 23/5384;
(Continued)

(56) References Cited

U.S. PATENT DOCUMENTS 2,230,663 A    2/1941  Alden
3,289,452 A    12/1966 Koellner
(Continued)

FOREIGN PATENT DOCUMENTS

CN    1352804 A    6/2002
CN    1641832 A    7/2005
(Continued)

OTHER PUBLICATIONS

International Search Report and Written Opinion for Application No. PCT/US2014/055695 dated Mar. 20, 2015.
(Continued)

*Primary Examiner* — Jarrett J Stark

(57) ABSTRACT

A microelectronic package can include a substrate having a first surface and a second surface opposite therefrom, the substrate having a first conductive element at the first surface, and a plurality of wire bonds, each of the wire bonds having a base electrically connected to a corresponding one of the first conductive elements and having a tip remote from the base, each wire bond having edge surfaces extending from the tip toward the base. The microelectronic package can also include an encapsulation having a major surface facing away from the first surface of the substrate, the encapsulation having a recess extending from the major surface in a direction toward the first surface of the substrate, the tip of a first one of the wire bonds being disposed within the recess, and an electrically conductive layer overlying an inner surface of the encapsulation exposed within the recess, the electrically conductive layer overlying and electrically connected with the tip of the first one of the wire bonds.

7 Claims, 7 Drawing Sheets

(51) Int. Cl.
*H01L 21/56* (2006.01)
*H01L 25/10* (2006.01)
*H01L 25/00* (2006.01)

(52) U.S. Cl.
CPC .............. *H01L 24/32* (2013.01); *H01L 24/49* (2013.01); *H01L 24/81* (2013.01); *H01L 24/85* (2013.01); *H01L 25/105* (2013.01); *H01L 25/50* (2013.01); *H01L 2224/1319* (2013.01); *H01L 2224/13109* (2013.01); *H01L 2224/13111* (2013.01); *H01L 2224/16111* (2013.01); *H01L 2224/16227* (2013.01); *H01L 2224/32225* (2013.01); *H01L 2224/45015* (2013.01); *H01L 2224/45147* (2013.01); *H01L 2224/48227* (2013.01); *H01L 2224/85355* (2013.01); *H01L 2225/1023* (2013.01); *H01L 2225/1058* (2013.01); *H01L 2225/1082* (2013.01); *H01L 2924/15311* (2013.01); *H01L 2924/19107* (2013.01)

(58) Field of Classification Search
CPC ... H01L 24/47–49; H01L 24/44; H01L 24/15; H01L 2224/16111
See application file for complete search history.

(56) References Cited

U.S. PATENT DOCUMENTS

| | | |
|---|---|---|
| 3,358,897 A | 12/1967 | Christensen |
| 3,430,835 A | 3/1969 | Grable et al. |
| 3,623,649 A | 11/1971 | Keisling |
| 3,795,037 A | 3/1974 | Luttmer |
| 3,900,153 A | 8/1975 | Beerwerth et al. |
| 4,067,104 A | 1/1978 | Tracy |
| 4,072,816 A | 2/1978 | Gedney et al. |
| 4,213,556 A | 7/1980 | Persson et al. |
| 4,327,860 A | 5/1982 | Kirshenboin et al. |
| 4,422,568 A | 12/1983 | Elles et al. |
| 4,437,604 A | 3/1984 | Razon et al. |
| 4,604,644 A | 8/1986 | Beckham et al. |
| 4,642,889 A | 2/1987 | Grabbe |
| 4,667,267 A | 5/1987 | Hernandez et al. |
| 4,695,870 A | 9/1987 | Patraw |
| 4,716,049 A | 12/1987 | Patraw |
| 4,725,692 A | 2/1988 | Ishii et al. |
| 4,771,930 A | 9/1988 | Gillotti et al. |
| 4,793,814 A | 12/1988 | Zifcak et al. |
| 4,804,132 A | 2/1989 | DiFrancesco |
| 4,845,354 A | 7/1989 | Gupta et al. |
| 4,867,267 A | 9/1989 | Carlson |
| 4,902,600 A | 2/1990 | Tamagawa et al. |
| 4,924,353 A | 5/1990 | Patraw |
| 4,925,083 A | 5/1990 | Farassat et al. |
| 4,955,523 A | 9/1990 | Carlommagno et al. |
| 4,975,079 A | 12/1990 | Beaman et al. |
| 4,982,265 A | 1/1991 | Watanabe et al. |
| 4,998,885 A | 3/1991 | Beaman |
| 4,999,472 A | 3/1991 | Neinast et al. |
| 5,067,007 A | 11/1991 | Otsuka et al. |
| 5,067,382 A | 11/1991 | Zimmerman et al. |
| 5,083,697 A | 1/1992 | Difrancesco |
| 5,095,187 A | 3/1992 | Gliga |
| 5,133,495 A | 7/1992 | Angulas et al. |
| 5,138,438 A | 8/1992 | Masayuki et al. |
| 5,148,265 A | 9/1992 | Khandros et al. |
| 5,148,266 A | 9/1992 | Khandros et al. |
| 5,186,381 A | 2/1993 | Kim |
| 5,189,505 A | 2/1993 | Bartelink |
| 5,196,726 A | 3/1993 | Nishiguchi et al. |
| 5,203,075 A | 4/1993 | Angulas et al. |
| 5,214,308 A | 5/1993 | Nishiguchi et al. |
| 5,220,489 A | 6/1993 | Barreto et al. |
| 5,222,014 A | 6/1993 | Lin |
| 5,238,173 A | 8/1993 | Ura et al. |
| 5,241,454 A | 8/1993 | Ameen et al. |
| 5,241,456 A | 8/1993 | Marcinkiewicz et al. |
| 5,316,788 A | 5/1994 | Dibble et al. |
| 5,340,771 A | 8/1994 | Rostoker |
| 5,346,118 A | 9/1994 | Degani et al. |
| 5,371,654 A | 12/1994 | Beaman et al. |
| 5,397,997 A | 3/1995 | Tuckerman et al. |
| 5,438,224 A | 8/1995 | Papageorge et al. |
| 5,455,390 A | 10/1995 | DiStefano et al. |
| 5,468,995 A | 11/1995 | Higgins, III |
| 5,476,211 A | 12/1995 | Khandros |
| 5,494,667 A | 2/1996 | Uchida et al. |
| 5,495,667 A | 3/1996 | Farnworth et al. |
| 5,518,964 A | 5/1996 | DiStefano et al. |
| 5,531,022 A | 7/1996 | Beaman et al. |
| 5,536,909 A | 7/1996 | DiStefano et al. |
| 5,541,567 A | 7/1996 | Fogel et al. |
| 5,571,428 A | 11/1996 | Nishimura et al. |
| 5,578,869 A | 11/1996 | Hoffman et al. |
| 5,608,265 A | 3/1997 | Kitano et al. |
| 5,615,824 A | 4/1997 | Fjelstad et al. |
| 5,635,846 A | 6/1997 | Beaman et al. |
| 5,656,550 A | 8/1997 | Tsuji et al. |
| 5,659,952 A | 8/1997 | Kovac et al. |
| 5,679,977 A | 10/1997 | Khandros et al. |
| 5,688,716 A | 11/1997 | DiStefano et al. |
| 5,718,361 A | 2/1998 | Braun et al. |
| 5,726,493 A | 3/1998 | Yamashita et al. |
| 5,731,709 A | 3/1998 | Pastore et al. |
| 5,736,780 A | 4/1998 | Murayama |
| 5,736,785 A | 4/1998 | Chiang et al. |
| 5,766,987 A | 6/1998 | Mitchell et al. |
| 5,787,581 A | 8/1998 | DiStefano et al. |
| 5,801,441 A | 9/1998 | DiStefano et al. |
| 5,802,699 A | 9/1998 | Fjelstad et al. |
| 5,811,982 A | 9/1998 | Beaman et al. |
| 5,821,763 A | 10/1998 | Beaman et al. |
| 5,830,389 A | 11/1998 | Capote et al. |
| 5,831,836 A | 11/1998 | Long et al. |
| 5,839,191 A | 11/1998 | Economy et al. |
| 5,854,507 A | 12/1998 | Miremadi et al. |
| 5,874,781 A | 2/1999 | Fogal et al. |
| 5,898,991 A | 5/1999 | Fogel et al. |
| 5,908,317 A | 6/1999 | Heo |
| 5,912,505 A | 6/1999 | Itoh et al. |
| 5,948,533 A | 9/1999 | Gallagher et al. |
| 5,953,624 A | 9/1999 | Bando et al. |
| 5,971,253 A | 10/1999 | Gilleo et al. |
| 5,973,391 A | 10/1999 | Bischoff et al. |
| 5,977,618 A | 11/1999 | DiStefano et al. |
| 5,977,640 A | 11/1999 | Bertin et al. |
| 5,980,270 A | 11/1999 | Fjelstad et al. |
| 5,989,936 A | 11/1999 | Smith et al. |
| 5,994,152 A | 11/1999 | Khandros et al. |
| 6,000,126 A | 12/1999 | Pai |
| 6,002,168 A | 12/1999 | Bellaar et al. |
| 6,032,359 A | 3/2000 | Carroll |
| 6,038,136 A | 3/2000 | Weber |
| 6,052,287 A | 4/2000 | Palmer et al. |
| 6,054,337 A | 4/2000 | Solberg |
| 6,054,756 A | 4/2000 | DiStefano et al. |
| 6,077,380 A | 6/2000 | Hayes et al. |
| 6,117,694 A | 9/2000 | Smith et al. |
| 6,121,676 A | 9/2000 | Solberg |
| 6,124,546 A | 9/2000 | Hayward et al. |
| 6,133,072 A | 10/2000 | Fjelstad |
| 6,145,733 A | 11/2000 | Streckfuss et al. |
| 6,157,080 A | 12/2000 | Tamaki et al. |
| 6,158,647 A | 12/2000 | Chapman et al. |
| 6,164,523 A | 12/2000 | Fauty et al. |
| 6,168,965 B1 | 1/2001 | Malinovich et al. |
| 6,177,636 B1 | 1/2001 | Fjelstad |
| 6,180,881 B1 | 1/2001 | Isaak |
| 6,194,250 B1 | 2/2001 | Melton et al. |
| 6,194,291 B1 | 2/2001 | DiStefano et al. |
| 6,202,297 B1 | 3/2001 | Faraci et al. |
| 6,206,273 B1 | 3/2001 | Beaman et al. |
| 6,208,024 B1 | 3/2001 | DiStefano |
| 6,211,572 B1 | 4/2001 | Fjelstad et al. |

(56) References Cited

U.S. PATENT DOCUMENTS

| | | | |
|---|---|---|---|
| 6,211,574 B1 | 4/2001 | Tao et al. |
| 6,215,670 B1 | 4/2001 | Khandros |
| 6,218,728 B1 | 4/2001 | Kimura |
| 6,225,688 B1 | 5/2001 | Kim et al. |
| 6,238,949 B1 | 5/2001 | Nguyen et al. |
| 6,258,625 B1 | 7/2001 | Brofman et al. |
| 6,260,264 B1 | 7/2001 | Chen et al. |
| 6,262,482 B1 | 7/2001 | Shiraishi et al. |
| 6,268,662 B1 | 7/2001 | Test et al. |
| 6,295,729 B1 | 10/2001 | Beaman et al. |
| 6,300,780 B1 | 10/2001 | Beaman et al. |
| 6,303,997 B1 | 10/2001 | Lee et al. |
| 6,313,528 B1 | 11/2001 | Solberg |
| 6,316,838 B1 | 11/2001 | Ozawa et al. |
| 6,329,224 B1 | 12/2001 | Nguyen et al. |
| 6,332,270 B2 | 12/2001 | Beaman et al. |
| 6,334,247 B1 | 1/2002 | Beaman et al. |
| 6,358,627 B2 | 3/2002 | Benenati et al. |
| 6,362,520 B2 | 3/2002 | DiStefano |
| 6,362,525 B1 | 3/2002 | Rahim |
| 6,376,769 B1 | 4/2002 | Chung |
| 6,388,333 B1 | 5/2002 | Taniguchi et al. |
| 6,395,199 B1 | 5/2002 | Krassowski et al. |
| 6,399,426 B1 | 6/2002 | Capote et al. |
| 6,407,448 B2 | 6/2002 | Chun |
| 6,407,456 B1 | 6/2002 | Ball |
| 6,410,431 B2 | 6/2002 | Bertin et al. |
| 6,413,850 B1 | 7/2002 | Ooroku et al. |
| 6,439,450 B1 | 8/2002 | Chapman et al. |
| 6,458,411 B1 | 10/2002 | Goossen et al. |
| 6,469,260 B2 | 10/2002 | Horiuchi et al. |
| 6,472,743 B2 | 10/2002 | Huang et al. |
| 6,476,503 B1 | 11/2002 | Imamura et al. |
| 6,476,506 B1 | 11/2002 | O'Connor |
| 6,476,583 B2 | 11/2002 | McAndrews |
| 6,486,545 B1 | 11/2002 | Glenn et al. |
| 6,489,182 B2 | 12/2002 | Kwon |
| 6,495,914 B1 | 12/2002 | Sekine et al. |
| 6,507,104 B2 | 1/2003 | Ho et al. |
| 6,509,639 B1 | 1/2003 | Lin |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,526,655 B2 | 3/2003 | Beaman et al. |
| 6,531,784 B1 | 3/2003 | Shim et al. |
| 6,545,228 B2 | 4/2003 | Hashimoto |
| 6,550,666 B2 | 4/2003 | Chew et al. |
| 6,555,918 B2 | 4/2003 | Masuda et al. |
| 6,560,117 B2 | 5/2003 | Moon |
| 6,563,205 B1 | 5/2003 | Fogal et al. |
| 6,573,458 B1 | 6/2003 | Matsubara et al. |
| 6,578,754 B1 | 6/2003 | Tung |
| 6,581,276 B2 | 6/2003 | Chung |
| 6,581,283 B2 | 6/2003 | Sugiura et al. |
| 6,624,653 B1 | 9/2003 | Cram |
| 6,630,730 B2 | 10/2003 | Grigg |
| 6,639,303 B2 | 10/2003 | Siniaguine |
| 6,647,310 B1 | 11/2003 | Yi et al. |
| 6,650,013 B2 | 11/2003 | Yin et al. |
| 6,653,170 B1 | 11/2003 | Lin |
| 6,684,007 B2 | 1/2004 | Yoshimura et al. |
| 6,686,268 B2 | 2/2004 | Farnworth et al. |
| 6,687,988 B1 | 2/2004 | Sugiura et al. |
| 6,696,305 B2 | 2/2004 | Kung et al. |
| 6,699,730 B2 | 3/2004 | Kim et al. |
| 6,708,403 B2 | 3/2004 | Beaman et al. |
| 6,720,783 B2 | 4/2004 | Satoh et al. |
| 6,730,544 B2 | 5/2004 | Yang |
| 6,733,711 B2 | 5/2004 | Durocher et al. |
| 6,734,539 B2 | 5/2004 | Degani et al. |
| 6,734,542 B2 | 5/2004 | Nakatani et al. |
| 6,740,980 B2 | 5/2004 | Hirose |
| 6,741,085 B1 | 5/2004 | Khandros et al. |
| 6,746,894 B2 | 6/2004 | Fee et al. |
| 6,759,738 B1 | 7/2004 | Fallon et al. |
| 6,762,078 B2 | 7/2004 | Shin et al. |
| 6,765,287 B1 | 7/2004 | Lin |
| 6,774,467 B2 | 8/2004 | Horiuchi et al. |
| 6,774,473 B1 | 8/2004 | Shen |
| 6,774,494 B2 | 8/2004 | Arakawa |
| 6,777,787 B2 | 8/2004 | Shibata |
| 6,777,797 B2 | 8/2004 | Egawa |
| 6,778,406 B2 | 8/2004 | Eldridge et al. |
| 6,780,746 B2 | 8/2004 | Kinsman et al. |
| 6,787,926 B2 | 9/2004 | Chen et al. |
| 6,790,757 B1 | 9/2004 | Chittipeddi et al. |
| 6,812,575 B2 | 11/2004 | Furusawa |
| 6,815,257 B2 | 11/2004 | Yoon et al. |
| 6,828,668 B2 | 12/2004 | Smith et al. |
| 6,844,619 B2 | 1/2005 | Tago |
| 6,856,235 B2 | 2/2005 | Fjelstad |
| 6,864,166 B1 | 3/2005 | Yin et al. |
| 6,867,499 B1 | 3/2005 | Tabrizi |
| 6,874,910 B2 | 4/2005 | Sugimoto et al. |
| 6,897,565 B2 | 5/2005 | Pflughaupt et al. |
| 6,900,530 B1 | 5/2005 | Tsai |
| 6,902,869 B2 | 6/2005 | Appelt et al. |
| 6,902,950 B2 | 6/2005 | Ma et al. |
| 6,906,408 B2 | 6/2005 | Cloud et al. |
| 6,908,785 B2 | 6/2005 | Kim |
| 6,930,256 B1 | 8/2005 | Huemoeller et al. |
| 6,933,608 B2 | 8/2005 | Fujisawa |
| 6,946,380 B2 | 9/2005 | Takahashi |
| 6,962,282 B2 | 11/2005 | Manansala |
| 6,962,864 B1 | 11/2005 | Jeng et al. |
| 6,977,440 B2 | 12/2005 | Pflughaupt et al. |
| 6,979,599 B2 | 12/2005 | Silverbrook |
| 6,987,032 B1 | 1/2006 | Fan et al. |
| 6,989,122 B1 | 1/2006 | Pham et al. |
| 7,009,297 B1 | 3/2006 | Chiang et al. |
| 7,045,884 B2 | 5/2006 | Standing |
| 7,051,915 B2 | 5/2006 | Mutaguchi |
| 7,053,485 B2 | 5/2006 | Bang et al. |
| 7,061,079 B2 | 6/2006 | Weng et al. |
| 7,061,097 B2 | 6/2006 | Yokoi |
| 7,067,911 B1 | 6/2006 | Lin et al. |
| 7,071,547 B2 | 7/2006 | Kang et al. |
| 7,071,573 B1 | 7/2006 | Lin |
| 7,119,427 B2 | 10/2006 | Kim |
| 7,121,891 B2 | 10/2006 | Cherian |
| 7,170,185 B1 | 1/2007 | Hogerton et al. |
| 7,176,506 B2 | 2/2007 | Beroz et al. |
| 7,176,559 B2 | 2/2007 | Ho et al. |
| 7,185,426 B1 | 3/2007 | Hiner et al. |
| 7,190,061 B2 | 3/2007 | Lee |
| 7,198,980 B2 | 4/2007 | Jiang et al. |
| 7,198,987 B1 | 4/2007 | Warren et al. |
| 7,205,670 B2 | 4/2007 | Oyama |
| 7,215,033 B2 | 5/2007 | Lee et al. |
| 7,225,538 B2 | 6/2007 | Eldridge et al. |
| 7,227,095 B2 | 6/2007 | Roberts et al. |
| 7,229,906 B2 | 6/2007 | Babinetz et al. |
| 7,233,057 B2 | 6/2007 | Hussa |
| 7,242,081 B1 * | 7/2007 | Lee ................. H01L 25/0657 257/686 |
| 7,246,431 B2 | 7/2007 | Bang et al. |
| 7,262,124 B2 | 8/2007 | Fujisawa |
| 7,262,506 B2 | 8/2007 | Mess et al. |
| 7,268,421 B1 | 9/2007 | Lin |
| 7,276,785 B2 | 10/2007 | Bauer et al. |
| 7,276,799 B2 | 10/2007 | Lee et al. |
| 7,287,322 B2 | 10/2007 | Mahieu et al. |
| 7,290,448 B2 | 11/2007 | Shirasaka et al. |
| 7,294,920 B2 | 11/2007 | Chen et al. |
| 7,294,928 B2 | 11/2007 | Bang et al. |
| 7,301,770 B2 | 11/2007 | Campbell et al. |
| 7,323,767 B2 | 1/2008 | James et al. |
| 7,327,038 B2 | 2/2008 | Kwon et al. |
| 7,344,917 B2 | 3/2008 | Gautham |
| 7,355,289 B2 | 4/2008 | Hess et al. |
| 7,365,416 B2 | 4/2008 | Kawabata et al. |
| 7,371,676 B2 | 5/2008 | Hembree |
| 7,372,151 B1 | 5/2008 | Fan et al. |
| 7,378,726 B2 | 5/2008 | Punzalan et al. |

(56) References Cited

U.S. PATENT DOCUMENTS

| | | | |
|---|---|---|---|
| 7,391,105 B2 | 6/2008 | Yeom |
| 7,391,121 B2 | 6/2008 | Otremba |
| 7,416,107 B2 | 8/2008 | Chapman et al. |
| 7,453,157 B2 | 11/2008 | Haba et al. |
| 7,456,091 B2 | 11/2008 | Kuraya et al. |
| 7,462,936 B2 | 12/2008 | Haba et al. |
| 7,476,608 B2 | 1/2009 | Craig et al. |
| 7,476,962 B2 | 1/2009 | Kim |
| 7,485,562 B2 | 2/2009 | Chua et al. |
| 7,485,969 B2 | 2/2009 | Corisis et al. |
| 7,495,179 B2 | 2/2009 | Kubota et al. |
| 7,495,342 B2 | 2/2009 | Beaman et al. |
| 7,517,733 B2 | 4/2009 | Camacho et al. |
| 7,528,474 B2 | 5/2009 | Lee |
| 7,535,090 B2 | 5/2009 | Furuyama et al. |
| 7,537,962 B2 | 5/2009 | Jang et al. |
| 7,538,565 B1 | 5/2009 | Beaman et al. |
| 7,550,836 B2 | 6/2009 | Chou et al. |
| 7,560,360 B2 | 7/2009 | Cheng et al. |
| 7,564,116 B2 | 7/2009 | Ahn et al. |
| 7,576,415 B2 | 8/2009 | Cha et al. |
| 7,576,439 B2 | 8/2009 | Craig et al. |
| 7,578,422 B2 | 8/2009 | Lange et al. |
| 7,582,963 B2 | 9/2009 | Gerber et al. |
| 7,589,394 B2 | 9/2009 | Kawano |
| 7,592,638 B2 | 9/2009 | Kim |
| 7,595,548 B2 | 9/2009 | Shirasaka et al. |
| 7,612,638 B2 | 11/2009 | Chung et al. |
| 7,621,436 B2 | 11/2009 | Mii et al. |
| 7,625,781 B2 | 12/2009 | Beer |
| 7,633,154 B2 | 12/2009 | Dai et al. |
| 7,633,765 B1 | 12/2009 | Scanlan et al. |
| 7,642,133 B2 | 1/2010 | Wu et al. |
| 7,646,102 B2 | 1/2010 | Boon |
| 7,659,617 B2 | 2/2010 | Kang et al. |
| 7,663,226 B2 | 2/2010 | Cho et al. |
| 7,670,940 B2 | 3/2010 | Mizukoshi et al. |
| 7,671,457 B1 | 3/2010 | Hiner et al. |
| 7,671,459 B2 | 3/2010 | Corisis et al. |
| 7,675,152 B2 | 3/2010 | Gerber et al. |
| 7,677,429 B2 | 3/2010 | Chapman et al. |
| 7,682,962 B2 | 3/2010 | Hembree |
| 7,683,460 B2 | 3/2010 | Heitzer et al. |
| 7,692,931 B2 | 4/2010 | Chong et al. |
| 7,696,631 B2 | 4/2010 | Beaulieu et al. |
| 7,706,144 B2 | 4/2010 | Lynch |
| 7,709,968 B2 | 5/2010 | Damberg et al. |
| 7,719,122 B2 | 5/2010 | Tsao et al. |
| 7,728,443 B2 | 6/2010 | Hembree |
| 7,737,545 B2 | 6/2010 | Fjelstad et al. |
| 7,750,483 B1 | 7/2010 | Lin et al. |
| 7,757,385 B2 | 7/2010 | Hembree |
| 7,777,238 B2 | 8/2010 | Nishida et al. |
| 7,777,328 B2 | 8/2010 | Enomoto |
| 7,777,351 B1 | 8/2010 | Berry et al. |
| 7,780,064 B2 | 8/2010 | Wong et al. |
| 7,781,877 B2 | 8/2010 | Jiang et al. |
| 7,795,717 B2 | 9/2010 | Goller |
| 7,800,233 B2 | 9/2010 | Kawano et al. |
| 7,808,093 B2 | 10/2010 | Kagaya et al. |
| 7,808,439 B2 | 10/2010 | Yang et al. |
| 7,815,323 B2 | 10/2010 | Saeki |
| 7,842,541 B1 | 11/2010 | Rusli et al. |
| 7,850,087 B2 | 12/2010 | Hwang et al. |
| 7,851,259 B2 | 12/2010 | Kim |
| 7,855,462 B2 | 12/2010 | Boon et al. |
| 7,857,190 B2 | 12/2010 | Takahashi et al. |
| 7,872,335 B2 | 1/2011 | Khan et al. |
| 7,876,180 B2 | 1/2011 | Uchimura |
| 7,880,290 B2 | 2/2011 | Park |
| 7,892,889 B2 | 2/2011 | Howard et al. |
| 7,902,644 B2 | 3/2011 | Huang et al. |
| 7,910,385 B2 | 3/2011 | Kweon et al. |
| 7,911,805 B2 | 3/2011 | Haba |
| 7,919,846 B2 | 4/2011 | Hembree |
| 7,928,552 B1 | 4/2011 | Cho et al. |
| 7,932,170 B1 | 4/2011 | Huemoeller et al. |
| 7,934,313 B1 | 5/2011 | Lin et al. |
| 7,939,934 B2 | 5/2011 | Haba et al. |
| 7,960,843 B2 | 6/2011 | Hedler et al. |
| 7,964,956 B1 | 6/2011 | Bet-Shliemoun |
| 7,967,062 B2 | 6/2011 | Campbell et al. |
| 7,974,099 B2 | 7/2011 | Grajcar |
| 7,977,597 B2 | 7/2011 | Roberts et al. |
| 7,990,711 B1 | 8/2011 | Andry et al. |
| 8,008,121 B2 | 8/2011 | Choi et al. |
| 8,012,797 B2 | 9/2011 | Shen et al. |
| 8,018,065 B2 | 9/2011 | Lam |
| 8,020,290 B2 | 9/2011 | Sheats |
| 8,035,213 B2 | 10/2011 | Lee et al. |
| 8,039,316 B2 | 10/2011 | Chi et al. |
| 8,039,970 B2 | 10/2011 | Yamamori et al. |
| 8,053,814 B2 | 11/2011 | Chen et al. |
| 8,053,879 B2 | 11/2011 | Lee et al. |
| 8,058,101 B2 | 11/2011 | Haba et al. |
| 8,071,424 B2 | 12/2011 | Kang et al. |
| 8,071,431 B2 | 12/2011 | Hoang et al. |
| 8,071,470 B2 | 12/2011 | Khor et al. |
| 8,076,770 B2 | 12/2011 | Kagaya et al. |
| 8,080,445 B1 | 12/2011 | Pagaila |
| 8,084,867 B2 | 12/2011 | Tang et al. |
| 8,092,734 B2 | 1/2012 | Jiang et al. |
| 8,093,697 B2 | 1/2012 | Haba et al. |
| 8,115,283 B1 | 2/2012 | Bolognia et al. |
| 8,120,054 B2 | 2/2012 | Seo et al. |
| 8,138,584 B2 | 3/2012 | Wang et al. |
| 8,174,119 B2 | 5/2012 | Pendse |
| 8,198,716 B2 | 6/2012 | Perlaman et al. |
| 8,207,604 B2 | 6/2012 | Haba et al. |
| 8,213,184 B2 | 7/2012 | Knickerbocker |
| 8,217,502 B2 | 7/2012 | Ko |
| 8,232,141 B2 | 7/2012 | Choi et al. |
| 8,237,257 B2 | 8/2012 | Yang |
| 8,264,091 B2 | 9/2012 | Cho et al. |
| 8,278,746 B2 | 10/2012 | Ding et al. |
| 8,288,854 B2 | 10/2012 | Weng et al. |
| 8,299,368 B2 | 10/2012 | Endo |
| 8,304,900 B2 | 11/2012 | Jang et al. |
| 8,314,492 B2 | 11/2012 | Egawa |
| 8,315,060 B2 | 11/2012 | Morikita et al. |
| 8,319,338 B1 | 11/2012 | Berry et al. |
| 8,324,633 B2 | 12/2012 | McKenzie et al. |
| 8,349,735 B2 | 1/2013 | Pagaila et al. |
| 8,354,297 B2 | 1/2013 | Pagaila et al. |
| 8,362,620 B2 | 1/2013 | Pagani |
| 8,372,741 B1 | 2/2013 | Co et al. |
| 8,395,259 B2 | 3/2013 | Eun |
| 8,399,972 B2 | 3/2013 | Hoang et al. |
| 8,404,520 B1 * | 3/2013 | Chau ............... H01L 23/49517 |
| | | 438/109 |
| 8,415,704 B2 | 4/2013 | Ivanov et al. |
| 8,419,442 B2 | 4/2013 | Horikawa et al. |
| 8,476,770 B2 | 7/2013 | Shao et al. |
| 8,482,111 B2 | 7/2013 | Haba |
| 8,492,201 B2 | 7/2013 | Pagaila et al. |
| 8,507,297 B2 | 8/2013 | Iida et al. |
| 8,508,045 B2 | 8/2013 | Khan et al. |
| 8,520,396 B2 | 8/2013 | Schmidt et al. |
| 8,525,214 B2 | 9/2013 | Lin et al. |
| 8,525,314 B2 | 9/2013 | Haba et al. |
| 8,525,318 B1 | 9/2013 | Kim et al. |
| 8,552,556 B1 | 10/2013 | Kim et al. |
| 8,558,392 B2 | 10/2013 | Chua et al. |
| 8,567,051 B2 | 10/2013 | Val |
| 8,618,659 B2 | 12/2013 | Sato et al. |
| 8,633,059 B2 | 1/2014 | Do et al. |
| 8,642,393 B2 | 2/2014 | Yu et al. |
| 8,646,508 B2 | 2/2014 | Kawada |
| 8,653,626 B2 | 2/2014 | Lo et al. |
| 8,653,668 B2 | 2/2014 | Uno et al. |
| 8,659,164 B2 | 2/2014 | Haba |
| 8,669,646 B2 | 3/2014 | Tabatabai et al. |
| 8,670,261 B2 | 3/2014 | Crisp et al. |
| 8,680,677 B2 | 3/2014 | Wyland |

(56) References Cited

U.S. PATENT DOCUMENTS

| | | |
|---|---|---|
| 8,680,684 B2 | 3/2014 | Haba et al. |
| 8,686,570 B2 | 4/2014 | Semmelmeyer et al. |
| 8,728,865 B2 | 5/2014 | Haba et al. |
| 8,729,714 B1 | 5/2014 | Meyer |
| 8,742,576 B2 | 6/2014 | Thacker et al. |
| 8,742,597 B2 | 6/2014 | Nickerson |
| 8,766,436 B2 | 7/2014 | Delucca et al. |
| 8,772,817 B2 | 7/2014 | Yao |
| 8,791,575 B2 | 7/2014 | Oganesian et al. |
| 8,791,580 B2 | 7/2014 | Park et al. |
| 8,796,135 B2 | 8/2014 | Oganesian et al. |
| 8,802,494 B2 | 8/2014 | Lee et al. |
| 8,810,031 B2 | 8/2014 | Chang et al. |
| 8,811,055 B2 | 8/2014 | Yoon |
| 8,816,404 B2 | 8/2014 | Kim et al. |
| 8,816,505 B2 | 8/2014 | Mohammed et al. |
| 8,835,228 B2 * | 9/2014 | Mohammed ............ H01L 24/18 438/127 |
| 8,836,136 B2 | 9/2014 | Chau et al. |
| 8,836,140 B2 | 9/2014 | Ma et al. |
| 8,836,147 B2 | 9/2014 | Uno et al. |
| 8,841,765 B2 | 9/2014 | Haba et al. |
| 8,878,353 B2 | 11/2014 | Haba et al. |
| 8,893,380 B2 | 11/2014 | Kim et al. |
| 8,907,466 B2 | 12/2014 | Haba |
| 8,907,500 B2 | 12/2014 | Haba et al. |
| 8,916,781 B2 | 12/2014 | Haba et al. |
| 8,922,005 B2 | 12/2014 | Hu et al. |
| 8,923,004 B2 | 12/2014 | Low et al. |
| 8,927,337 B2 | 1/2015 | Haba et al. |
| 8,946,757 B2 | 2/2015 | Mohammed et al. |
| 8,948,712 B2 | 2/2015 | Chen et al. |
| 8,963,339 B2 | 2/2015 | He et al. |
| 8,975,726 B2 | 3/2015 | Chen |
| 8,978,247 B2 | 3/2015 | Yang et al. |
| 8,981,559 B2 | 3/2015 | Hsu et al. |
| 8,987,132 B2 | 3/2015 | Gruber et al. |
| 8,988,895 B2 | 3/2015 | Mohammed et al. |
| 8,993,376 B2 | 3/2015 | Camacho et al. |
| 9,012,263 B1 | 4/2015 | Mathew et al. |
| 9,054,095 B2 | 6/2015 | Pagaila |
| 9,093,435 B2 | 7/2015 | Sato et al. |
| 9,095,074 B2 | 7/2015 | Haba et al. |
| 9,105,483 B2 | 8/2015 | Chau et al. |
| 9,117,811 B2 | 8/2015 | Zohni |
| 9,123,664 B2 | 9/2015 | Haba |
| 9,128,123 B2 | 9/2015 | Liu et al. |
| 9,136,254 B2 | 9/2015 | Zhao et al. |
| 9,153,562 B2 | 10/2015 | Haba et al. |
| 9,167,710 B2 | 10/2015 | Mohammed et al. |
| 9,196,586 B2 | 11/2015 | Chen et al. |
| 9,196,588 B2 | 11/2015 | Leal |
| 9,209,081 B2 | 12/2015 | Lim et al. |
| 9,214,434 B1 | 12/2015 | Kim et al. |
| 9,224,647 B2 | 12/2015 | Koo et al. |
| 9,224,717 B2 | 12/2015 | Sato et al. |
| 9,263,394 B2 | 2/2016 | Uzoh et al. |
| 9,263,413 B2 | 2/2016 | Mohammed |
| 9,318,449 B2 | 4/2016 | Hasch et al. |
| 9,318,452 B2 | 4/2016 | Chen et al. |
| 9,324,696 B2 | 4/2016 | Choi et al. |
| 9,330,945 B2 | 5/2016 | Song et al. |
| 9,362,161 B2 | 6/2016 | Chi et al. |
| 9,379,074 B2 | 6/2016 | Uzoh et al. |
| 9,379,078 B2 * | 6/2016 | Yu ............................ H01L 24/17 |
| 9,401,338 B2 | 7/2016 | Magnus et al. |
| 9,405,064 B2 | 8/2016 | Herbsommer et al. |
| 9,412,661 B2 | 8/2016 | Lu et al. |
| 9,418,971 B2 | 8/2016 | Chen et al. |
| 9,437,459 B2 | 9/2016 | Carpenter et al. |
| 9,443,797 B2 | 9/2016 | Marimuthu et al. |
| 9,449,941 B2 * | 9/2016 | Tsai ................... H01L 25/0652 |
| 9,461,025 B2 | 10/2016 | Yu et al. |
| 9,484,291 B1 * | 11/2016 | Dhandapani ............ H01L 24/04 |
| 9,496,152 B2 * | 11/2016 | Cho ................... H01L 21/4853 |
| 9,508,622 B2 | 11/2016 | Higgins |
| 9,559,088 B2 | 1/2017 | Gonzalez et al. |
| 9,570,382 B2 | 2/2017 | Haba |
| 9,583,456 B2 | 2/2017 | Uzoh et al. |
| 9,601,454 B2 | 3/2017 | Zhao et al. |
| 9,653,442 B2 | 5/2017 | Yu et al. |
| 9,659,877 B2 | 5/2017 | Bakalski et al. |
| 9,663,353 B2 | 5/2017 | Ofner et al. |
| 9,735,084 B2 | 8/2017 | Katkar et al. |
| 9,788,466 B2 | 10/2017 | Chen |
| 9,812,402 B2 * | 11/2017 | Awujoola .............. H01L 23/552 |
| 2001/0002607 A1 | 6/2001 | Sugiura et al. |
| 2001/0006252 A1 | 7/2001 | Kim et al. |
| 2001/0007370 A1 | 7/2001 | Distefano |
| 2001/0021541 A1 | 9/2001 | Akram et al. |
| 2001/0028114 A1 | 10/2001 | Hosomi |
| 2001/0040280 A1 | 11/2001 | Funakura et al. |
| 2001/0042925 A1 | 11/2001 | Yamamoto et al. |
| 2001/0045012 A1 | 11/2001 | Beaman et al. |
| 2001/0048151 A1 | 12/2001 | Chun |
| 2002/0014004 A1 | 2/2002 | Beaman et al. |
| 2002/0066952 A1 | 6/2002 | Taniguchi et al. |
| 2002/0096787 A1 | 7/2002 | Fjelstad |
| 2002/0117330 A1 | 8/2002 | Eldridge et al. |
| 2002/0125556 A1 | 9/2002 | Oh et al. |
| 2002/0125571 A1 | 9/2002 | Corisis et al. |
| 2002/0153602 A1 | 10/2002 | Tay et al. |
| 2002/0164838 A1 | 11/2002 | Moon et al. |
| 2002/0171152 A1 | 11/2002 | Miyazaki |
| 2002/0185735 A1 | 12/2002 | Sakurai et al. |
| 2002/0190738 A1 | 12/2002 | Beaman et al. |
| 2003/0002770 A1 | 1/2003 | Chakravorty et al. |
| 2003/0006494 A1 | 1/2003 | Lee et al. |
| 2003/0048108 A1 | 3/2003 | Beaman et al. |
| 2003/0057544 A1 | 3/2003 | Nathan et al. |
| 2003/0068906 A1 | 4/2003 | Light et al. |
| 2003/0094666 A1 | 5/2003 | Clayton et al. |
| 2003/0094685 A1 | 5/2003 | Shiraishi et al. |
| 2003/0094700 A1 | 5/2003 | Aiba et al. |
| 2003/0106213 A1 | 6/2003 | Beaman et al. |
| 2003/0107118 A1 | 6/2003 | Pflughaupt et al. |
| 2003/0124767 A1 | 7/2003 | Lee et al. |
| 2003/0162378 A1 | 8/2003 | Mikami |
| 2003/0164540 A1 | 9/2003 | Lee et al. |
| 2003/0234277 A1 | 12/2003 | Dias et al. |
| 2004/0014309 A1 | 1/2004 | Nakanishi |
| 2004/0036164 A1 | 2/2004 | Koike et al. |
| 2004/0038447 A1 | 2/2004 | Corisis et al. |
| 2004/0041757 A1 | 3/2004 | Yang et al. |
| 2004/0075164 A1 | 4/2004 | Pu et al. |
| 2004/0090756 A1 | 5/2004 | Ho et al. |
| 2004/0110319 A1 | 6/2004 | Fukutomi et al. |
| 2004/0119152 A1 | 6/2004 | Karnezos et al. |
| 2004/0124518 A1 | 7/2004 | Karnezos |
| 2004/0148773 A1 | 8/2004 | Beaman et al. |
| 2004/0152292 A1 | 8/2004 | Babinetz et al. |
| 2004/0160751 A1 | 8/2004 | Inagaki et al. |
| 2004/0164426 A1 | 8/2004 | Pai et al. |
| 2004/0188499 A1 | 9/2004 | Nosaka |
| 2004/0262728 A1 | 12/2004 | Sterrett et al. |
| 2004/0262734 A1 | 12/2004 | Yoo |
| 2005/0017369 A1 | 1/2005 | Clayton et al. |
| 2005/0035440 A1 | 2/2005 | Mohammed |
| 2005/0062173 A1 | 3/2005 | Vu et al. |
| 2005/0062492 A1 | 3/2005 | Beaman et al. |
| 2005/0082664 A1 | 4/2005 | Funaba et al. |
| 2005/0095835 A1 | 5/2005 | Humpston et al. |
| 2005/0116326 A1 | 6/2005 | Haba et al. |
| 2005/0121764 A1 | 6/2005 | Mallik et al. |
| 2005/0133916 A1 | 6/2005 | Karnezos |
| 2005/0133932 A1 | 6/2005 | Pohl et al. |
| 2005/0140265 A1 | 6/2005 | Hirakata |
| 2005/0146008 A1 | 7/2005 | Miyamoto et al. |
| 2005/0151235 A1 | 7/2005 | Yokoi |
| 2005/0151238 A1 | 7/2005 | Yamunan |
| 2005/0161814 A1 | 7/2005 | Mizukoshi et al. |
| 2005/0173805 A1 | 8/2005 | Damberg et al. |
| 2005/0173807 A1 | 8/2005 | Zhu et al. |
| 2005/0176233 A1 | 8/2005 | Joshi et al. |

(56) References Cited

U.S. PATENT DOCUMENTS

| | | |
|---|---|---|
| 2005/0181544 A1 | 8/2005 | Haba et al. |
| 2005/0181655 A1 | 8/2005 | Haba et al. |
| 2005/0212109 A1 | 9/2005 | Cherukuri et al. |
| 2005/0253213 A1 | 11/2005 | Jiang et al. |
| 2005/0266672 A1 | 12/2005 | Jeng et al. |
| 2005/0285246 A1 | 12/2005 | Haba et al. |
| 2006/0087013 A1 | 4/2006 | Hsieh |
| 2006/0118641 A1 | 6/2006 | Hwang et al. |
| 2006/0139893 A1 | 6/2006 | Yoshimura et al. |
| 2006/0166397 A1 | 7/2006 | Lau et al. |
| 2006/0197220 A1 | 9/2006 | Beer |
| 2006/0216868 A1 | 9/2006 | Yang et al. |
| 2006/0228825 A1 | 10/2006 | Hembree |
| 2006/0255449 A1 | 11/2006 | Lee et al. |
| 2006/0278682 A1 | 12/2006 | Lange et al. |
| 2006/0278970 A1 | 12/2006 | Yano et al. |
| 2007/0010086 A1 | 1/2007 | Hsieh |
| 2007/0013067 A1 | 1/2007 | Nishida et al. |
| 2007/0015353 A1 | 1/2007 | Craig et al. |
| 2007/0035015 A1 | 2/2007 | Hsu |
| 2007/0045803 A1 | 3/2007 | Ye et al. |
| 2007/0080360 A1 | 4/2007 | Mirsky et al. |
| 2007/0090524 A1 | 4/2007 | Abbott |
| 2007/0126091 A1 | 6/2007 | Wood et al. |
| 2007/0148822 A1 | 6/2007 | Haba et al. |
| 2007/0164457 A1 | 7/2007 | Yamaguchi et al. |
| 2007/0181989 A1 | 8/2007 | Corisis et al. |
| 2007/0190747 A1 | 8/2007 | Humpston et al. |
| 2007/0235850 A1 | 10/2007 | Gerber et al. |
| 2007/0235856 A1 | 10/2007 | Haba et al. |
| 2007/0241437 A1 | 10/2007 | Kagaya et al. |
| 2007/0246819 A1 | 10/2007 | Hembree et al. |
| 2007/0254406 A1 | 11/2007 | Lee |
| 2007/0271781 A9 | 11/2007 | Beaman et al. |
| 2007/0290325 A1 | 12/2007 | Wu et al. |
| 2008/0006942 A1 | 1/2008 | Park et al. |
| 2008/0017968 A1 | 1/2008 | Choi et al. |
| 2008/0023805 A1 | 1/2008 | Howard et al. |
| 2008/0029849 A1 | 2/2008 | Hedler et al. |
| 2008/0032519 A1 | 2/2008 | Murata |
| 2008/0042265 A1 | 2/2008 | Merilo et al. |
| 2008/0047741 A1 | 2/2008 | Beaman et al. |
| 2008/0048309 A1 | 2/2008 | Corisis et al. |
| 2008/0048690 A1 | 2/2008 | Beaman et al. |
| 2008/0048691 A1 | 2/2008 | Beaman et al. |
| 2008/0048697 A1 | 2/2008 | Beaman et al. |
| 2008/0054434 A1 | 3/2008 | Kim |
| 2008/0073769 A1 | 3/2008 | Wu et al. |
| 2008/0073771 A1 | 3/2008 | Seo et al. |
| 2008/0076208 A1 | 3/2008 | Wu et al. |
| 2008/0100316 A1 | 5/2008 | Beaman et al. |
| 2008/0100317 A1 | 5/2008 | Beaman et al. |
| 2008/0100318 A1 | 5/2008 | Beaman et al. |
| 2008/0100324 A1 | 5/2008 | Beaman et al. |
| 2008/0105984 A1 | 5/2008 | Lee |
| 2008/0106281 A1 | 5/2008 | Beaman et al. |
| 2008/0106282 A1 | 5/2008 | Beaman et al. |
| 2008/0106283 A1 | 5/2008 | Beaman et al. |
| 2008/0106284 A1 | 5/2008 | Beaman et al. |
| 2008/0106285 A1 | 5/2008 | Beaman et al. |
| 2008/0106291 A1 | 5/2008 | Beaman et al. |
| 2008/0106872 A1 | 5/2008 | Beaman et al. |
| 2008/0111568 A1 | 5/2008 | Beaman et al. |
| 2008/0111569 A1 | 5/2008 | Beaman et al. |
| 2008/0111570 A1 | 5/2008 | Beaman et al. |
| 2008/0112144 A1 | 5/2008 | Beaman et al. |
| 2008/0112145 A1 | 5/2008 | Beaman et al. |
| 2008/0112146 A1 | 5/2008 | Beaman et al. |
| 2008/0112147 A1 | 5/2008 | Beaman et al. |
| 2008/0112148 A1 | 5/2008 | Beaman et al. |
| 2008/0112149 A1 | 5/2008 | Beaman et al. |
| 2008/0116912 A1 | 5/2008 | Beaman et al. |
| 2008/0116913 A1 | 5/2008 | Beaman et al. |
| 2008/0116914 A1 | 5/2008 | Beaman et al. |
| 2008/0116915 A1 | 5/2008 | Beaman et al. |
| 2008/0116916 A1 | 5/2008 | Beaman et al. |
| 2008/0117611 A1 | 5/2008 | Beaman et al. |
| 2008/0117612 A1 | 5/2008 | Beaman et al. |
| 2008/0117613 A1 | 5/2008 | Beaman et al. |
| 2008/0121879 A1 | 5/2008 | Beaman et al. |
| 2008/0123310 A1 | 5/2008 | Beaman et al. |
| 2008/0129319 A1 | 6/2008 | Beaman et al. |
| 2008/0129320 A1 | 6/2008 | Beaman et al. |
| 2008/0132094 A1 | 6/2008 | Beaman et al. |
| 2008/0156518 A1 | 7/2008 | Honer et al. |
| 2008/0164595 A1 | 7/2008 | Wu et al. |
| 2008/0169548 A1 | 7/2008 | Baek |
| 2008/0211084 A1 | 9/2008 | Chow et al. |
| 2008/0217708 A1 | 9/2008 | Reisner et al. |
| 2008/0230887 A1 | 9/2008 | Sun et al. |
| 2008/0246126 A1 | 10/2008 | Bowles et al. |
| 2008/0277772 A1 | 11/2008 | Groenhuis et al. |
| 2008/0277776 A1* | 11/2008 | Enomoto .............. H01L 21/486 257/700 |
| 2008/0280393 A1* | 11/2008 | Lee .......................... H01L 24/11 438/107 |
| 2008/0284001 A1 | 11/2008 | Mori et al. |
| 2008/0284045 A1 | 11/2008 | Gerber et al. |
| 2008/0299757 A1* | 12/2008 | Wen ......................... H01L 24/11 438/614 |
| 2008/0303132 A1 | 12/2008 | Mohammed et al. |
| 2008/0303153 A1 | 12/2008 | Oi et al. |
| 2008/0308305 A1 | 12/2008 | Kawabe |
| 2008/0315385 A1 | 12/2008 | Gerber et al. |
| 2009/0008796 A1 | 1/2009 | Eng et al. |
| 2009/0014876 A1 | 1/2009 | Youn et al. |
| 2009/0026609 A1 | 1/2009 | Masuda |
| 2009/0032913 A1 | 2/2009 | Haba |
| 2009/0039523 A1 | 2/2009 | Jiang et al. |
| 2009/0045497 A1 | 2/2009 | Kagaya et al. |
| 2009/0050994 A1 | 2/2009 | Ishihara et al. |
| 2009/0079094 A1 | 3/2009 | Lin |
| 2009/0085185 A1 | 4/2009 | Byun et al. |
| 2009/0085205 A1* | 4/2009 | Sugizaki ................. B81B 7/007 257/737 |
| 2009/0091009 A1 | 4/2009 | Corisis et al. |
| 2009/0091022 A1 | 4/2009 | Meyer et al. |
| 2009/0102063 A1 | 4/2009 | Lee et al. |
| 2009/0104736 A1 | 4/2009 | Haba et al. |
| 2009/0115044 A1 | 5/2009 | Hoshino et al. |
| 2009/0121351 A1 | 5/2009 | Endo |
| 2009/0127686 A1 | 5/2009 | Yang et al. |
| 2009/0128176 A1 | 5/2009 | Beaman et al. |
| 2009/0140415 A1 | 6/2009 | Furuta |
| 2009/0146301 A1 | 6/2009 | Shimizu et al. |
| 2009/0146303 A1 | 6/2009 | Kwon |
| 2009/0160065 A1 | 6/2009 | Haba et al. |
| 2009/0166664 A1 | 7/2009 | Park et al. |
| 2009/0166873 A1 | 7/2009 | Yang et al. |
| 2009/0189288 A1 | 7/2009 | Beaman et al. |
| 2009/0194829 A1 | 8/2009 | Chung et al. |
| 2009/0206461 A1 | 8/2009 | Yoon |
| 2009/0212418 A1 | 8/2009 | Gurrum et al. |
| 2009/0212442 A1 | 8/2009 | Chow et al. |
| 2009/0236700 A1 | 9/2009 | Moriya |
| 2009/0236753 A1 | 9/2009 | Moon et al. |
| 2009/0239336 A1 | 9/2009 | Lee et al. |
| 2009/0256229 A1 | 10/2009 | Ishikawa et al. |
| 2009/0261466 A1 | 10/2009 | Pagaila et al. |
| 2009/0302445 A1 | 12/2009 | Pagaila et al. |
| 2009/0315579 A1 | 12/2009 | Beaman et al. |
| 2009/0316378 A1 | 12/2009 | Haba et al. |
| 2010/0000775 A1 | 1/2010 | Shen et al. |
| 2010/0003822 A1 | 1/2010 | Miyata et al. |
| 2010/0006963 A1 | 1/2010 | Brady |
| 2010/0007009 A1 | 1/2010 | Chang et al. |
| 2010/0007026 A1 | 1/2010 | Shikano |
| 2010/0025835 A1 | 2/2010 | Oh et al. |
| 2010/0032822 A1 | 2/2010 | Liao et al. |
| 2010/0044860 A1 | 2/2010 | Haba et al. |
| 2010/0052135 A1 | 3/2010 | Shim et al. |
| 2010/0052187 A1 | 3/2010 | Lee et al. |
| 2010/0078789 A1 | 4/2010 | Choi et al. |
| 2010/0078795 A1 | 4/2010 | Dekker et al. |

(56) References Cited

U.S. PATENT DOCUMENTS

| | | |
|---|---|---|
| 2010/0087035 A1 | 4/2010 | Yoo et al. |
| 2010/0090330 A1 | 4/2010 | Nakazato |
| 2010/0109138 A1 | 5/2010 | Cho |
| 2010/0117212 A1 | 5/2010 | Corisis et al. |
| 2010/0133675 A1 | 6/2010 | Yu et al. |
| 2010/0148360 A1* | 6/2010 | Lin .................... H01L 21/6835 257/737 |
| 2010/0148374 A1 | 6/2010 | Castro |
| 2010/0171205 A1 | 7/2010 | Chen et al. |
| 2010/0193937 A1 | 8/2010 | Nagamatsu et al. |
| 2010/0200981 A1 | 8/2010 | Huang et al. |
| 2010/0213560 A1 | 8/2010 | Wang et al. |
| 2010/0224975 A1 | 9/2010 | Shin et al. |
| 2010/0232129 A1 | 9/2010 | Haba et al. |
| 2010/0237471 A1 | 9/2010 | Pagaila et al. |
| 2010/0246141 A1 | 9/2010 | Leung et al. |
| 2010/0258955 A1 | 10/2010 | Miyagawa et al. |
| 2010/0289142 A1 | 11/2010 | Shim et al. |
| 2010/0314748 A1 | 12/2010 | Hsu et al. |
| 2010/0320585 A1 | 12/2010 | Jiang et al. |
| 2010/0327419 A1 | 12/2010 | Muthukumar et al. |
| 2011/0042699 A1 | 2/2011 | Park et al. |
| 2011/0057308 A1 | 3/2011 | Choi et al. |
| 2011/0068453 A1 | 3/2011 | Cho et al. |
| 2011/0068478 A1 | 3/2011 | Pagaila et al. |
| 2011/0115081 A1 | 5/2011 | Osumi |
| 2011/0140259 A1 | 6/2011 | Cho et al. |
| 2011/0147911 A1 | 6/2011 | Kohl et al. |
| 2011/0157834 A1 | 6/2011 | Wang |
| 2011/0175213 A1 | 7/2011 | Mori et al. |
| 2011/0177643 A1* | 7/2011 | Chiu .................... B81B 7/007 438/51 |
| 2011/0209908 A1 | 9/2011 | Lin et al. |
| 2011/0215472 A1 | 9/2011 | Chandrasekaran |
| 2011/0220395 A1 | 9/2011 | Cho et al. |
| 2011/0223721 A1 | 9/2011 | Cho et al. |
| 2011/0237027 A1 | 9/2011 | Kim et al. |
| 2011/0241192 A1 | 10/2011 | Ding et al. |
| 2011/0241193 A1 | 10/2011 | Ding et al. |
| 2011/0272449 A1 | 11/2011 | Pirkle et al. |
| 2011/0272798 A1 | 11/2011 | Lee et al. |
| 2012/0001336 A1 | 1/2012 | Zeng et al. |
| 2012/0007232 A1 | 1/2012 | Haba |
| 2012/0015481 A1 | 1/2012 | Kim |
| 2012/0018885 A1 | 1/2012 | Lee et al. |
| 2012/0020026 A1 | 1/2012 | Oganesian et al. |
| 2012/0025365 A1 | 2/2012 | Haba |
| 2012/0034777 A1 | 2/2012 | Pagaila et al. |
| 2012/0043655 A1 | 2/2012 | Khor et al. |
| 2012/0056312 A1 | 3/2012 | Pagaila et al. |
| 2012/0061814 A1 | 3/2012 | Camacho et al. |
| 2012/0063090 A1 | 3/2012 | Hsiao et al. |
| 2012/0080787 A1 | 4/2012 | Shah et al. |
| 2012/0086111 A1 | 4/2012 | Iwamoto et al. |
| 2012/0086130 A1 | 4/2012 | Sasaki et al. |
| 2012/0088332 A1* | 4/2012 | Lee .................... H01L 21/561 438/113 |
| 2012/0104595 A1 | 5/2012 | Haba et al. |
| 2012/0104624 A1 | 5/2012 | Choi et al. |
| 2012/0119380 A1 | 5/2012 | Haba |
| 2012/0126431 A1 | 5/2012 | Kim et al. |
| 2012/0145442 A1 | 6/2012 | Gupta et al. |
| 2012/0146235 A1 | 6/2012 | Choi et al. |
| 2012/0153444 A1 | 6/2012 | Haga et al. |
| 2012/0184116 A1 | 7/2012 | Pawlikowski et al. |
| 2012/0280374 A1 | 11/2012 | Choi et al. |
| 2012/0280386 A1 | 11/2012 | Sato et al. |
| 2012/0326337 A1 | 12/2012 | Camacho et al. |
| 2013/0001797 A1 | 1/2013 | Choi et al. |
| 2013/0032944 A1 | 2/2013 | Sato et al. |
| 2013/0037802 A1 | 2/2013 | England et al. |
| 2013/0040423 A1 | 2/2013 | Tung |
| 2013/0049218 A1 | 2/2013 | Gong et al. |
| 2013/0049221 A1 | 2/2013 | Han et al. |
| 2013/0069222 A1 | 3/2013 | Camacho |
| 2013/0082399 A1 | 4/2013 | Kim et al. |
| 2013/0087915 A1 | 4/2013 | Warren et al. |
| 2013/0093087 A1* | 4/2013 | Chau .................. H01L 23/49517 257/738 |
| 2013/0093088 A1 | 4/2013 | Chau et al. |
| 2013/0095610 A1 | 4/2013 | Chau et al. |
| 2013/0105979 A1 | 5/2013 | Yu et al. |
| 2013/0134588 A1 | 5/2013 | Yu et al. |
| 2013/0153646 A1 | 6/2013 | Ho |
| 2013/0182402 A1 | 7/2013 | Chen et al. |
| 2013/0200524 A1 | 8/2013 | Han et al. |
| 2013/0200533 A1 | 8/2013 | Chau et al. |
| 2013/0224914 A1* | 8/2013 | Co .................... H01L 24/03 438/126 |
| 2013/0234317 A1 | 9/2013 | Chen et al. |
| 2013/0241083 A1 | 9/2013 | Yu et al. |
| 2013/0256847 A1 | 10/2013 | Park et al. |
| 2013/0323409 A1 | 12/2013 | Read et al. |
| 2014/0021605 A1 | 1/2014 | Yu et al. |
| 2014/0035892 A1 | 2/2014 | Shenoy et al. |
| 2014/0036454 A1 | 2/2014 | Caskey et al. |
| 2014/0103527 A1 | 4/2014 | Marimuthu et al. |
| 2014/0124949 A1 | 5/2014 | Paek et al. |
| 2014/0210101 A1* | 7/2014 | Lin .................... H01L 24/19 257/774 |
| 2014/0220744 A1 | 8/2014 | Damberg et al. |
| 2014/0225248 A1 | 8/2014 | Henderson et al. |
| 2014/0239479 A1 | 8/2014 | Start |
| 2014/0239490 A1 | 8/2014 | Wang |
| 2014/0264945 A1 | 9/2014 | Yap et al. |
| 2014/0312503 A1 | 10/2014 | Seo |
| 2015/0017765 A1 | 1/2015 | Co et al. |
| 2015/0044823 A1 | 2/2015 | Mohammed |
| 2015/0076714 A1 | 3/2015 | Haba et al. |
| 2015/0130054 A1* | 5/2015 | Lee .................... H01L 23/5384 257/737 |
| 2015/0340305 A1 | 11/2015 | Lo |
| 2015/0380376 A1 | 12/2015 | Mathew et al. |
| 2016/0043813 A1 | 2/2016 | Chen et al. |
| 2016/0225692 A1 | 8/2016 | Kim et al. |
| 2017/0117231 A1 | 4/2017 | Awujoola et al. |
| 2017/0117243 A1* | 4/2017 | Katkar ................ H01L 24/16 |
| 2017/0229432 A1* | 8/2017 | Lin .................... H01L 24/19 |

FOREIGN PATENT DOCUMENTS

| | | |
|---|---|---|
| CN | 1877824 A | 12/2006 |
| CN | 101409241 A | 4/2009 |
| CN | 101449375 A | 6/2009 |
| CN | 101675516 A | 3/2010 |
| CN | 101819959 A | 9/2010 |
| CN | 102324418 A | 1/2012 |
| DE | 102009001461 A1 | 9/2010 |
| EP | 920058 | 6/1999 |
| EP | 1449414 A1 | 8/2004 |
| EP | 2234158 A1 | 9/2010 |
| JP | S51-050661 | 5/1976 |
| JP | 59189069 | 10/1984 |
| JP | 61125062 A | 6/1986 |
| JP | S62158338 A | 7/1987 |
| JP | 62-226307 | 10/1987 |
| JP | 1012769 A | 1/1989 |
| JP | 64-71162 | 3/1989 |
| JP | H04-346436 A | 12/1992 |
| JP | 06268015 A | 9/1994 |
| JP | H06268101 A | 9/1994 |
| JP | H06333931 A | 12/1994 |
| JP | 07-122787 A | 5/1995 |
| JP | 09505439 | 5/1997 |
| JP | H1065054 A | 3/1998 |
| JP | H10-135221 A | 5/1998 |
| JP | H10135220 A | 5/1998 |
| JP | 1118364 | 1/1999 |
| JP | 11-074295 A | 3/1999 |
| JP | 11135663 A | 5/1999 |
| JP | H11-145323 A | 5/1999 |
| JP | 11251350 A | 9/1999 |
| JP | H11-260856 A | 9/1999 |

(56) References Cited

FOREIGN PATENT DOCUMENTS

| | | |
|---|---|---|
| JP | 11317476 | 11/1999 |
| JP | 2000156461 A | 6/2000 |
| JP | 2000323516 A | 11/2000 |
| JP | 3157134 A | 4/2001 |
| JP | 2001196407 A | 7/2001 |
| JP | 2001326236 A | 11/2001 |
| JP | 2002050871 A | 2/2002 |
| JP | 2002289769 A | 10/2002 |
| JP | 2003122611 A | 4/2003 |
| JP | 2003-174124 A | 6/2003 |
| JP | 2003197668 A | 7/2003 |
| JP | 2003307897 A | 10/2003 |
| JP | 2003318327 A | 11/2003 |
| JP | 2004031754 A | 1/2004 |
| JP | 200447702 | 2/2004 |
| JP | 2004047702 A | 2/2004 |
| JP | 2004048048 A | 2/2004 |
| JP | 2004-172157 A | 6/2004 |
| JP | 2004-200316 A | 7/2004 |
| JP | 2004281514 A | 10/2004 |
| JP | 2004-319892 A | 11/2004 |
| JP | 2004327855 A | 11/2004 |
| JP | 2004327856 A | 11/2004 |
| JP | 2004343030 A | 12/2004 |
| JP | 2005011874 A | 1/2005 |
| JP | 2005033141 A | 2/2005 |
| JP | 2005093551 A | 4/2005 |
| JP | 2003377641 A | 6/2005 |
| JP | 2005142378 A | 6/2005 |
| JP | 2005175019 A | 6/2005 |
| JP | 2003426392 A | 7/2005 |
| JP | 2005183880 A | 7/2005 |
| JP | 2005183923 A | 7/2005 |
| JP | 2005203497 A | 7/2005 |
| JP | 2005302765 A | 10/2005 |
| JP | 2006108588 A | 4/2006 |
| JP | 2006186086 A | 7/2006 |
| JP | 2006344917 | 12/2006 |
| JP | 2007123595 A | 5/2007 |
| JP | 2007-208159 A | 8/2007 |
| JP | 2007194436 A | 8/2007 |
| JP | 2007234845 A | 9/2007 |
| JP | 2007287922 A | 11/2007 |
| JP | 2007-335464 | 12/2007 |
| JP | 2007335464 A | 12/2007 |
| JP | 200834534 A | 2/2008 |
| JP | 2008166439 A | 7/2008 |
| JP | 2008171938 A | 7/2008 |
| JP | 2008235378 A | 10/2008 |
| JP | 2008251794 A | 10/2008 |
| JP | 2008277362 A | 11/2008 |
| JP | 2008306128 A | 12/2008 |
| JP | 2009004650 A | 1/2009 |
| JP | 2009-508324 A | 2/2009 |
| JP | 2009044110 A | 2/2009 |
| JP | 2009506553 | 2/2009 |
| JP | 2009064966 A | 3/2009 |
| JP | 2009088254 A | 4/2009 |
| JP | 2009111384 A | 5/2009 |
| JP | 2009528706 A | 8/2009 |
| JP | 2009260132 A | 11/2009 |
| JP | 2010103129 A | 5/2010 |
| JP | 2010135671 A | 6/2010 |
| JP | 2010192928 A | 9/2010 |
| JP | 2010199528 A | 9/2010 |
| JP | 2010206007 A | 9/2010 |
| JP | 2011514015 A | 4/2011 |
| JP | 2011166051 A | 8/2011 |
| KR | 100265563 | 9/2000 |
| KR | 20010061849 A | 7/2001 |
| KR | 2001-0094894 A | 11/2001 |
| KR | 10-0393102 | 7/2002 |
| KR | 20020058216 A | 7/2002 |
| KR | 20060064291 A | 6/2006 |
| KR | 20080020069 A | 3/2008 |
| KR | 100865125 B1 | 10/2008 |
| KR | 20080094251 A | 10/2008 |
| KR | 100886100 B1 | 2/2009 |
| KR | 20090033605 A | 4/2009 |
| KR | 20090123680 A | 12/2009 |
| KR | 20100033012 A | 3/2010 |
| KR | 20100062315 A | 6/2010 |
| KR | 101011863 B1 | 1/2011 |
| KR | 20120075855 A | 7/2012 |
| KR | 101215271 B1 | 12/2012 |
| KR | 20130048810 A | 5/2013 |
| KR | 20150012285 A | 2/2015 |
| TW | 200539406 A | 12/2005 |
| TW | 200721327 A | 6/2007 |
| TW | 200810079 A | 2/2008 |
| TW | 200849551 A | 12/2008 |
| TW | 200933760 A | 8/2009 |
| TW | 201023277 A | 6/2010 |
| TW | 201250979 A | 12/2012 |
| TW | 20130048810 B | 11/2017 |
| WO | 9615458 A1 | 5/1996 |
| WO | 02/13256 A1 | 2/2002 |
| WO | 03045123 A1 | 5/2003 |
| WO | 2004077525 A2 | 9/2004 |
| WO | 2006050691 A2 | 5/2006 |
| WO | 2007101251 A2 | 9/2007 |
| WO | 2007116544 A1 | 10/2007 |
| WO | 2008065896 A1 | 6/2008 |
| WO | 2008120755 A1 | 10/2008 |
| WO | 2009096950 A1 | 8/2009 |
| WO | 2009158098 A2 | 12/2009 |
| WO | 2010014103 A1 | 2/2010 |
| WO | 2010041630 A1 | 4/2010 |
| WO | 2010101163 A1 | 9/2010 |
| WO | 2012067177 A1 | 5/2012 |
| WO | 2013059181 A1 | 4/2013 |
| WO | 2013065895 A1 | 5/2013 |
| WO | 2014107301 A1 | 7/2014 |

OTHER PUBLICATIONS

International Preliminary Report on Patentability, Chapter II, for Application No. PCT/US2014/055695 dated Dec. 15, 2015.
International Search Report and Written Opinion for Application No. PCT/US2014/050148 dated Feb. 9, 2015.
Partial International Search Report for Application No. PCT/US2014/014181 dated May 8, 2014.
International Search Report and Written Opinion for Application No. PCT/US2014/014181 dated Jun. 13, 2014.
Taiwanese Office Action for Application No. 103103350 dated Mar. 21, 2016.
U.S. Appl. No. 13/477,532, filed May 22, 2012.
International Search Report and Written Opinion for Application No. PCT/US2014/050125 dated Feb. 4, 2015.
Written Opinion for Application No. PCT/US2014/050125 dated Jul. 15, 2015.
Neo-Manhattan Technology, A Novel HDI Manufacturing Process, High-Density Interconnects for Advanced Flex Substrates & 3-D Package Stacking, IPC Flex & Chips Symposium, Tempe, AZ, Feb. 11-12, 2003.
North Corporation, "Processed Intra-layer Interconnection Material for PWBs [Etched Copper Bump with Copper Foil]," NMBITM, Version 2001.6.
Kim et al., "Application of Through Mold Via (TMV) as PoP base package", 6 pages (2008).
International Search Report, PCT/US2005/039716, dated Apr. 5, 2006.
International Search Report Application No. PCT/US2011/024143, dated Sep. 14, 2011.
Korean Search Report KR10-2011-0041843 dated Feb. 24, 2011.
International Search Report and Written Opinion PCT/US2011/044342 dated May 7, 2012.
Bang, U.S. Appl. No. 10/656,534, filed Sep. 5, 2003.
International Search Report and Written Opinion for Application No. PCT/US2011/044346 dated May 11, 2012.

(56) References Cited

OTHER PUBLICATIONS

Partial International Search Report from Invitation to Pay Additional Fees for Application No. PCT/US2012/028738 dated Jun. 6, 2012.
Korean Office Action for Application No. 10-2011-0041843 dated Jun. 20, 2011.
"EE Times Asia" [online]. [Retrieved Aug. 5, 2010]. Retrieved from internet. <http://www.eetasia.com/ART_8800428222_480300_nt_dec52276.HTM>, 4 pages.
Redistributed Chip Package (RCP) Technology, Freescale Semiconductor, 2005, 6 pages.
"Wafer Level Stack—WDoD", [online]. [Retrieved Aug. 5, 2010]. Retrieved from the internet. <http://www.3d-plus.com/techno-wafer-level-stack-wdod.php>, 2 pages.
Jin, Yonggang et al., "STM 3D-IC Package and 3D eWLB Development," STMicroelectronics Singapore/STMicroelectronics France May 21, 2010.
Yoon, PhD, Seung Wook, "Next Generation Wafer Level Packaging Solution for 3D integration," May 2010, STATS ChipPAC LTD.
Search Report from Korean Patent Applicatin No. 10-2010-0113271 dated Jan. 12, 2011.
International Search Report and Written Opinion for PCT/US2011/060551 dated Apr. 18, 2012.
Mieser S, "Klein und Komplex", Elektronik, IRL Press Limited, DE, vol. 41, No. 1, Jan. 7, 1992 (Jan. 7, 1992), pp. 72-77, XP000277326. (International Search Report for Application No. PCT/US2012/060402 dated Feb. 21, 2013 provides concise statement of relevance.).
Partial International Search Report for Application No. PCT/US2012/060402 dated Feb. 21, 2013.
International Search Report and Written Opinion for Application No. PCT/US2012/060402 dated Apr. 2, 2011.
Partial International Search Report for Application No. PCT/US2013/026126 dated Jun. 17, 2013.
International Search Report and Written Opinion for Application No. PCT/US2013/026126 dated Jul. 25, 2013.
Extended European Search Report for Application No. EP13162975 dated Sep. 5, 2013.
International Search Report and Written Opinion for Application No. PCT/US2013/052883 dated Oct. 21, 2013.
Japanese Office Action for Application No. 2013-509325 dated Oct. 18, 2013.
Office Action from U.S. Appl. No. 12/769,930 dated May 5, 2011.
International Search Report and Written Opinion for Application No. PCT/US2013/053437 dated Nov. 25, 2013.
International Search Report and Written Opinion for Application No. PCT/US2013/041981 dated Nov. 13, 2013.
Office Action for Taiwan Application No. 100125521 dated Dec. 20, 2013.
Office Action from Taiwan for Application No. 100125522 dated Jan. 27, 2014.
Partial International Search Report for Application No. PCT/US2013/075672 dated Mar. 12, 2014.
Taiwanese Office Action for Application No. 100141695 dated Mar. 19, 2014.
International Search Report and Written Opinion for Application No. PCT/US2013/075672 dated Apr. 22, 2014.
Taiwanese Office Action for Application No. 101138311 dated Jun. 27, 2014.
Chinese Office Action for Application No. 201180022247.8 dated Sep. 16, 2014.
International Search Report and Written Opinion for Application No. PCT/US2011/024143 dated Jan. 17, 2012.
Taiwanese Office Action for Application No. 100140428 dated Jan. 26, 2015.
Korean Office Action for Application No. 2014-7025992 dated Feb. 5, 2015.
Japanese Office Action for Application No. 2013-520776 dated Apr. 21, 2015.
International Search Report and Written Opinion for Application No. PCT/US2015/011715 dated Apr. 20, 2015.
Chinese Office Action for Application No. 201180022247.8 dated Apr. 14, 2015.
Japanese Office Action for Application No. 2013-520777 dated May 22, 2015.
Chinese Office Action for Application No. 201310264264.3 dated May 12, 2015.
Partial International Search Report for Application No. PCT/US2015/033004 dated Sep. 9, 2015.
Taiwanese Office Action for Application No. 102106326 dated Sep. 18, 2015.
Brochure, "High Performance BVA PoP Package for Mobile Systems," Invensas Corporation, May 2013, 20 pages.
Brochure, "Invensas BVA PoP for Mobile Computing: Ultra High IO Without TSVs," Invensas Corporation, Jun. 26, 2012, 4 pag.
Brochure, "Invensas BVA PoP for Mobile Computing: 100+GB/s BVA PoP," Invensas Corporation, c. 2012, 2 pages.
Campos et al., "System in Package Solutions Using Fan-Out Wafer Level Packaging Technology," SEMI Networking Day, Jun. 27, 2013, 31 pages.
Ghaffarian Ph.D., Reza et al., "Evaluation Methodology Guidance for Stack Packages," Jet Propulsion Laboratory, California Institute of Technology, Pasadena, CA, NASA, Oct. 2009, 44 pages.
IBM et al., "Method of Producing Thin-Film Wirings with Vias," IBM Technical Disclosure Bulletin, Apr. 1, 1989, IBM Corp., (Thornwood), US-ISSN 0018-8689, vol. 31, No. 11, pp. 209-210, https://priorart.ip.com.
International Search Report and Written Opinion for Appln. No. PCT/US2015/032679, dated Nov. 11, 2015.
International Search Report and Written Opinion for Appln. No. PCT/US2016/056402, dated Jan. 31, 2017.
NTK HTCC Package General Design Guide, Communication Media Components Group, NGK Spark Plug Co., Ltd., Komaki, Aichi, Japan, Apr. 2010, 32 pages.
Partial International Search Report for Appln. No. PCT/US2015/032679, dated Sep. 4, 2015.
International Search Report and Written Opinion for Appln. No. PCT/US2016/056526, dated Jan. 20, 2017.
International Search Report and Written Opinion for Appln. No. PCT/US2016/068297, dated Apr. 17, 2017.
Taiwan Search Report for 105128420, dated Sep. 26, 2017.
International Search Report and Written Opinion for Appln. No. PCT/US2017/064437, dated Mar. 29, 2018.
Chinese Office Action Search Report for Application No. 2014800551784 dated Jan. 23, 2018.
European Search Report for Appln. No. EP12712792, dated Feb. 27, 2018, 2 pages.

* cited by examiner

ANCHORING STRUCTURE OF FINE PITCH BVA

CROSS-REFERENCE TO RELATED APPLICATION

This application claims the benefit of the filing date of U.S. Provisional Patent Application No. 62/245,573 filed Oct. 23, 2015, the disclosure of which is hereby incorporated herein by reference.

BACKGROUND OF THE INVENTION

Embodiments of the invention herein relate to various structures and ways of making microelectronic packages which can be used in package on package assemblies, and more particularly, to such structures that incorporate wire bonds for as part of the package-on-package connections.

Microelectronic devices such as semiconductor chips typically require many input and output connections to other electronic components. The input and output contacts of a semiconductor chip or other comparable device are generally disposed in grid-like patterns that substantially cover a surface of the device (commonly referred to as an "area array") or in elongated rows which may extend parallel to and adjacent each edge of the device's front surface, or in the center of the front surface. Typically, devices such as chips must be physically mounted on a substrate such as a printed circuit board, and the contacts of the device must be electrically connected to electrically conductive features of the circuit board.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls, typically about 0.1 mm and about 0.8 mm (5 and 30 mils) in diameter, attached to the terminals of the package. A package having an array of solder balls projecting from its bottom surface is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This is advantageous in that it reduces the overall size of the assembly and permits the use of short interconnections between various devices on the substrate, which in turn limits signal propagation time between devices and thus facilitates operation of the assembly at high speeds.

Packaged semiconductor chips are often provided in "stacked" arrangements, wherein one package is provided, for example, on a circuit board, and another package is mounted on top of the first package. These arrangements can allow a number of different chips to be mounted within a single footprint on a circuit board and can further facilitate high-speed operation by providing a short interconnection between packages. Often, this interconnect distance is only slightly larger than the thickness of the chip itself. For interconnection to be achieved within a stack of chip packages, it is necessary to provide structures for mechanical and electrical connection on both sides of each package (except for the topmost package). This has been done, for example, by providing contact pads or lands on both sides of the substrate to which the chip is mounted, the pads being connected through the substrate by conductive vias or the like. Solder balls or the like have been used to bridge the gap between the contacts on the top of a lower substrate to the contacts on the bottom of the next higher substrate. The solder balls must be higher than the height of the chip in order to connect the contacts. Examples of stacked chip arrangements and interconnect structures are provided in U.S. Patent App. Pub. No. 2010/0232129 ("the '129 Publication"), the disclosure of which is incorporated by reference herein in its entirety.

Microcontact elements in the form of elongated posts or pins may be used to connect microelectronic packages to circuit boards and for other connections in microelectronic packaging. In some instances, microcontacts have been formed by etching a metallic structure including one or more metallic layers to form the microcontacts. The etching process limits the size of the microcontacts. Conventional etching processes typically cannot form microcontacts with a large ratio of height to maximum width, referred to herein as "aspect ratio". It has been difficult or impossible to form arrays of microcontacts with appreciable height and very small pitch or spacing between adjacent microcontacts. Moreover, the configurations of the microcontacts formed by conventional etching processes are limited.

Despite all of the above-described advances in the art, still further improvements in making and testing microelectronic packages would be desirable.

BRIEF SUMMARY OF THE INVENTION

A microelectronic package can include a substrate having a first surface and a second surface opposite therefrom, the substrate having a first conductive element at the first surface, and a plurality of wire bonds, each of the wire bonds having a base electrically connected to a corresponding one of the first conductive elements and having a tip remote from the base, each wire bond having edge surfaces extending from the tip toward the base. The microelectronic package can also include an encapsulation having a major surface facing away from the first surface of the substrate, the encapsulation having a recess extending from the major surface in a direction toward the first surface of the substrate, the tip of a first one of the wire bonds being disposed within the recess, and an electrically conductive layer overlying an inner surface of the encapsulation exposed within the recess, the electrically conductive layer overlying and electrically connected with the tip of the first one of the wire bonds. In a particular example, a system including any of the microelectronic packages described herein can further include one or more other electronic components electrically connected to the microelectronic package. In one embodiment, the system can also include a housing, the microelectronic package and the one or more other electronic components being assembled with the housing.

A method of forming a microelectronic assembly can include placing a mold frame onto tips of wire bonds extending from a surface of a first substrate, the mold frame having a contact surface and protrusions extending from the contact surface, the tips of the wire bonds contacting the protrusions, and depositing an encapsulation onto the surface of the first substrate, the encapsulation separating adjacent ones of the wire bonds from one another, the protrusions defining recesses extending into the encapsulation from a major surface thereof. The method can also include forming an electrically conductive layer overlying an inner surface of the encapsulation exposed within the recesses, the electrically conductive layer overlying and electrically connected with the tips of the wire bonds, and forming joining units at least partially extending within the recesses, the joining units electrically connected to the wire bonds, the joining units separated from the inner surfaces of the recesses and the tips of the wire bonds by the electrically conductive layer.

A method of forming a microelectronic assembly can include forming barrier layers overlying and electrically connected with respective tips of wire bonds extending from a surface of a first substrate, and forming joining units overlying respective ones of the barrier layers and electrically connected to corresponding ones of the wire bonds, the joining units separated from the tips of the wire bonds by the barrier layers. The method can also include placing a mold frame onto tips of the joining units, the tips of the wire bonds partially extending into a mold film defining a lower surface of the mold frame, and depositing an encapsulation onto the surface of the first substrate, the encapsulation separating adjacent ones of the wire bonds from one another, the joining units each having a first portion disposed in recesses extending into the encapsulation below a major surface thereof, the tips of the joining units extending above the major surface of the encapsulation.

DETAILED DESCRIPTION

Figure 1A:
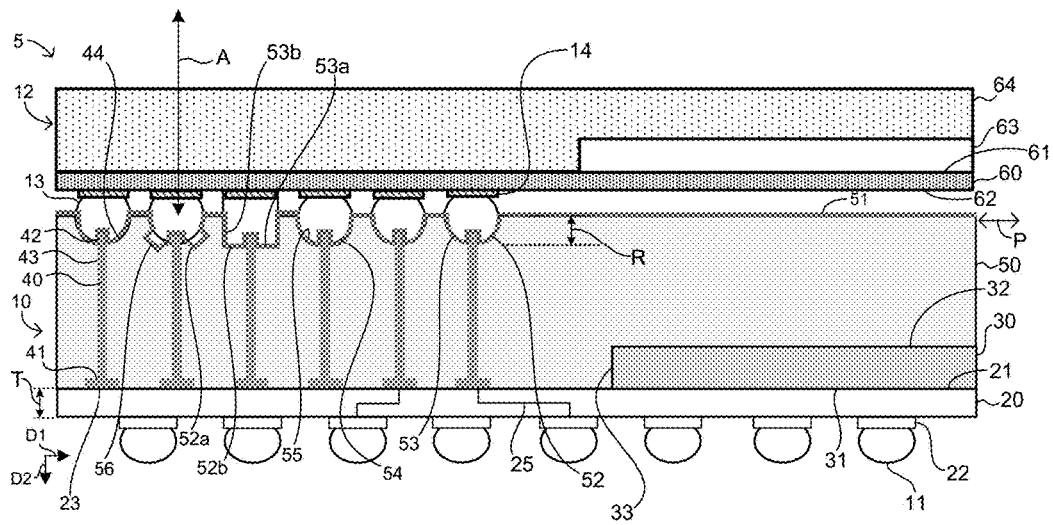
FIG. 1A illustrates a partial side sectional view of a microelectronic assembly including a first microelectronic package that can be formed using a wire bond interconnect process according to an embodiment of the invention, the wire bonds of the first microelectronic package electrically connected to corresponding conductive elements of a second microelectronic package.

Disclosed herein is a structure and process that can improve interconnect quality and reliability of wire bonds that can have a thickness of less than 2 mils (~51 microns), less than 1.5 mils (~38 microns), or even less than 1 mil (~25 microns). Some of the following advantages can be achieved: (i) reliable wire bonds with greater I/O, smaller pitch and smaller PoP thickness; (ii) improved mechanical reliability (e.g., by eliminating the conventional underfill requirement); (iii) improved heat dissipation by eliminating underfill; and (iv) improved wire barrier coating to reduce intermetallic compound ("IMC") formation/diffusion rate and to enhance the thermal cycle and interface stress reliability.

As used in this disclosure, terms such as "upper," "lower," "top," "bottom," "above," "below," and similar terms denoting directions, refer to the frame of reference of the components themselves, rather than to the gravitational frame of reference. With the parts oriented in the gravitational frame of reference in the directions shown in the figures, with the top of drawing being up and the bottom of the drawing being down in the gravitational frame of reference, the top surface of the microelectronic element is, indeed, above the bottom surface of the microelectronic element in the gravitational frame of reference. However, when the parts are turned over, with the top of the drawing facing downwardly in the gravitational frame of reference, the top surface of the microelectronic element is below the bottom surface of the microelectronic element in the gravitational frame of reference.

As used in this disclosure with reference to a component, e.g., an interposer, microelectronic element, circuit panel, substrate, etc., a statement that an electrically conductive element is "at" a surface of a component indicates that, when the component is not assembled with any other element, the electrically conductive element is available for contact with a theoretical point moving in a direction perpendicular to the surface of the component toward the surface of the component from outside the component. Thus, a terminal or other conductive element which is at a surface of a substrate may project from such surface; may be flush with such surface; or may be recessed relative to such surface in a hole or depression in the substrate. As used herein, the terms "about" and "approximately" with respect to a given numerical value means that the actual value is within a typical manufacturing tolerance known to one skilled in the relevant art of the given numerical value.

FIG. 1A illustrates a particular type of microelectronic assembly 5 including a first microelectronic package 10 and a second microelectronic package 12 joined thereto. The microelectronic package 10 can include packaging structure, for example, a generally planar element in the form of a substrate 20 having a first surface 21 and a second surface 22 opposite the first surface. The substrate 20 may include a dielectric element, which in some cases can consist essentially of polymeric material, e.g., a resin or polyimide, among others, and which may be substantially flat. The substrate 20 may be sheet-like and may be thin. Alternatively, the substrate 20 can include a dielectric element having a composite construction such as glass-reinforced epoxy, e.g., of BT resin or FR-4 construction. In particular embodiments, the dielectric element can include one or more layers of organic dielectric material or composite dielectric materials, such as, without limitation: polyimide, polytetrafluoroethylene ("PTFE"), epoxy, epoxy-glass, FR-4, BT resin, thermoplastic, or thermoset plastic materials.

In one example, the substrate can include a supporting element of material having a coefficient of thermal expansion ("CTE") of less than 12 parts per million per degree Celsius ("ppm/° C."), on which the contacts 24, terminals 25, and other conductive structure can be disposed. For example, such low CTE element can consist essentially of glass, ceramic, semiconductor material, or liquid crystal polymer material, or a combination of such materials. Alternatively, the substrate 20 can be a circuit panel or circuit board. In one example thereof, the substrate 20 can be a module board of a dual-inline memory module ("DIMM"). In one example, the substrate 20 can include a supporting element of material having a CTE of less than 30 ppm/° C. in the plane of the dielectric element, i.e., in a direction along its surface.

The first surface 21 and second surface 22 can be substantially parallel to each other and spaced apart at a distance perpendicular to the surfaces defining the thickness of the substrate T. The thickness of the substrate 20 can be within a range of generally acceptable thicknesses for the present application. In one embodiment, the distance between the first surface 21 and the second surface 22 is between about 10-500 μm. For purposes of this discussion, the first surface 21 may be described as being positioned opposite or remote from the second surface 22. Such a description, as well as any other description of the relative position of elements used herein that refers to a vertical or horizontal position of such elements is made for illustrative purposes only to correspond with the position of the elements within the drawings, and is not limiting.

First and second transverse directions D1, D2 (shown in FIG. 1B) parallel to the first surface 21 of the substrate 20 are referred to herein as "horizontal" or "lateral" directions, whereas the directions (e.g., D3 shown in FIG. 1A) perpendicular to the first surface are referred to herein as upward or downward directions and are also referred to herein as the "vertical" directions. The directions referred to herein are in the frame of reference of the structures referred to. Thus, these directions may lie at any orientation to the normal "up" or "down" directions in a gravitational frame of reference. A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

Electrically conductive contacts 23 and electrically conductive terminals 24, in the form of conductive pads, lands, or conductive posts, can be arranged, respectively, at the first and second surfaces 21, 22. The contacts 23 and the terminals 24 can be flat, thin electrically conductive elements. The contacts 23 and the terminals 24 can be a solid metal material, such as copper, gold, nickel, palladium, or other materials that are acceptable for such an application, including various alloys including one or more of copper, gold, nickel, palladium or combinations thereof. At least some of the contacts 23 can be interconnected to corresponding terminals 24. Such an interconnection may be completed using vias 25 formed in the substrate 20 that can be lined or filled with conductive metal that can be formed of the same material as the contacts 23 and the terminals 24. Optionally, the contacts 23 and the terminals 24 can be further interconnected to one another by traces (not shown) on the substrate 20.

The terminals 24 can be configured for connecting the microelectronic package 10 to at least one component external to the microelectronic package. The terminals 24 can function as endpoints for the connection of the microelectronic package 10 with corresponding electrically conductive elements of an external component such as the contacts of a circuit panel, e.g., printed wiring board, flexible circuit panel, socket, other microelectronic assembly or package, interposer, or passive component assembly, among others.

The microelectronic package 10 can include joining elements 11 attached to the terminals 24 for connection with an external component. The joining elements 11 can be, for example, masses of a bond metal such as solder, tin, indium, a eutectic composition or combination thereof, or another joining material such as an electrically conductive paste, an electrically conductive adhesive or electrically conductive matrix material or a combination of any or all of such bond metals or electrically conductive materials. In a particular embodiment, the joints between the terminals 24 and contacts of an external component can include an electrically conductive matrix material such as described in U.S. Pat. Nos. 8,890,304 and 9,117,811, the disclosures of which are hereby incorporated herein by reference. In a particular embodiment, the joints can have a similar structure or be formed in a manner as described therein.

The microelectronic package 10 can include a microelectronic element 30 joined to the first surface 21 of the substrate 20. The microelectronic element 30 can be mechanically coupled to the first surface 21 of the substrate 20, e.g., with an adhesive material, with a bottom surface 31 of the microelectronic element confronting the first surface of the substrate. The microelectronic element 30 can have a top surface 32 opposite the bottom surface 31. The microelectronic element can have element contacts (not shown) at either or both of the bottom and top surfaces 31, 32. As described herein, the element contacts of the microelectronic element 30 can also be referred to as "chip contacts." In one example, the element contacts of the microelectronic element 30 can be at one of the bottom or top surfaces 31 or 32 within a central region thereof. For example, the element contacts can be arranged in one or two parallel rows adjacent the center of the bottom or top surface 31 or 32.

Although in the figures, the particular electrical connection between the microelectronic element 30 and the substrate 20 is not shown, the invention contemplates various types of electrical connections between the microelectronic element and the substrate, including, for example, a "flip-chip" configuration, where element contacts (not shown) at the bottom surface 31 of the microelectronic element 30 can be connected to conductive elements at the first surface 21 of the substrate 20, such as by conductive joining elements (not shown) that are positioned beneath the microelectronic element. In some embodiments, such conductive joining elements can be, for example, masses of a bond metal such as solder, tin, indium, a eutectic composition or combination thereof, or another joining material such as an electrically conductive paste, an electrically conductive adhesive or electrically conductive matrix material or a combination of any or all of such bond metals or electrically conductive materials.

In one example, element contacts at the bottom surface 31 of the microelectronic element 30 can be electrically connected with contacts at the second surface 22 of the substrate 20 by conductive structure (e.g., wire bonds or lead bonds) extending through an aperture in the substrate. In another example, element contacts at the top surface 32 of the microelectronic element 30 can be electrically connected with contacts at the first surface 21 of the substrate 20 by conductive structure (e.g, wire bonds) extending above the top surface of the microelectronic element.

In some embodiments, the microelectronic element 30 can each be a semiconductor chip, a wafer, or the like. For example, the microelectronic element 30 can each comprise a memory storage element such as a dynamic random access memory ("DRAM") storage array or that is configured to predominantly function as a DRAM storage array (e.g., a DRAM integrated circuit chip). As used herein, a "memory storage element" refers to a multiplicity of memory cells arranged in an array, together with circuitry usable to store and retrieve data therefrom, such as for transport of the data over an electrical interface. In one example, the microelectronic element 30 can have memory storage array function. In a particular embodiment, the microelectronic element 30 can embody a greater number of active devices to provide memory storage array function than any other function.

The microelectronic element 30 can embody a plurality of active devices (e.g., transistors, diodes, etc.), a plurality of passive devices (e.g., resistors, capacitors, inductors, etc.), or both active devices and passive devices. In a particular embodiment, the microelectronic element 30 can be configured to have a predominant function as a logic chip, e.g., a programmable general or special purpose processor, a microcontroller, a field programmable gate array ("FPGA") device, an application specific integrated circuit ("ASIC"), a digital signal processor, among others, or a predominant function other than as a logic chip, such as a memory, for example, a volatile memory storage area, e.g., dynamic random access memory ("DRAM"), static random access memory ("SRAM"), a nonvolatile memory storage array such as flash memory or magnetic random access memory ("MRAM"). As such, the embodiment of FIG. 1 is in the form of an in-process packaged microelectronic element such as a semiconductor chip assembly that is used in computer or other electronic applications.

Although in the figures, a single microelectronic element 30 is shown in the microelectronic package 10 (and in the other microelectronic packages herein), each microelectronic package in this disclosure can include a plurality of microelectronic elements, arranged either adjacent to one another along the first surface 21 of the substrate 20, in a vertical stack overlying the first surface of the substrate, or in other configurations known in the art.

The microelectronic package 10 can include a plurality of wire bonds 40 that can be joined with at least some of the contacts 23. Each of the wire bonds 40 can be bonded at a base 41 thereof, such as a ball bond or a wedge bond, to a respective contact 23. Each of the wire bonds 40 can extend to a tip 42 (i.e., end surface) remote from the base 41 of such wire bond and remote from the substrate 20, and can include an edge surface 43 extending from the tip 42 to the base 41. In particular examples, the wire bonds 40 can have a diameter of 2 mils (~51 microns), less than 2 mils, 1.5 mils (~38 microns), less than 1.5 mils, 1 mil (~25 microns), or less than 1 mil.

The tips 42 of the wire bonds 40 can be available for electrical connection, either directly or indirectly as through a joining element 13 (e.g., a solder ball or other conductive joining material), electrically conductive contact, or other features discussed herein, to conductive elements 14 of another component external to the first microelectronic package 10, shown in FIG. 1A, for example, as the second microelectronic package 12. The tips 42 or the unencapsulated ends 44 of the wire bonds 40 and/or the joining elements 13 can therefore function as upper terminals of the first microelectronic package 10.

The particular size and shape of bases 41 of the wire bonds 40 can vary according to the type of material used to form the wire bonds, the desired strength of the connection between the wire bonds and the contacts 23, or the particular process used to form the wire bonds. The wire bonds 40 can have a construction and can be formed on the substrate 20 extending from the contacts 23 in any suitable manner, such as described in U.S. Patent Application Pub. No. 2013/0093087, filed Feb. 24, 2012, which is hereby incorporated by reference herein.

As shown in FIG. 1A, each wire bond 40 extends substantially vertically (parallel to the direction D3) between the base 41 and the tip 42. However, that need not always be the case. Any of the embodiments of the invention described herein contemplate having wire bonds 40 extend in a variety of directions and having one or more bends in the wire bonds that change the direction in which the wire bonds extend along its length between the base 41 and the tip 42. For example, the wire bonds 40 can have shapes and bends as shown and described in pending U.S. patent application Ser. No. 15/086,899, filed Mar. 31, 2016, which is hereby incorporated by reference herein.

The invention also contemplates the use of a stiffening or reinforcing dielectric layer that can extend between adjacent ones of the individual wire bonds, formed over lower portions of the edge surfaces 43 of the wire bonds 40. Such a reinforcing dielectric layer can improve the stiffness of the wire bonds, so that the position of the tips 42 can be maintained when a molding film is placed over the tips while the encapsulation 50 is formed. Such a reinforcing dielectric layer that may be added to the embodiments described herein is shown and described in pending U.S. patent application Ser. No. 15/086,899, filed Mar. 31, 2016, which is hereby incorporated by reference herein.

The microelectronic package 10 can include an encapsulation 50 that can be formed extending between the individual wire bonds 40 and overlying the top surface 32 of the microelectronic element 30 and the first surface 21 of the substrate 20. The encapsulation 50 can be formed from a dielectric material, such as those materials known in the art as being typically used for encapsulations or overmolds. In the embodiment of FIG. 1A, the encapsulation 50 can be formed, for example, by film-assisted molding or like techniques, over the portions of the first surface 21 of the substrate 20 that are not otherwise covered by or occupied by the microelectronic element 30, or the contacts 23.

The encapsulation 50, desirably an integral, continuous dielectric layer, can serve to protect the conductive elements within the microelectronic package 10, particularly the wire bonds 40. The encapsulation 50 can also substantially cover the microelectronic element 30, the wire bonds 40, including the bases 41 and at least a portion of edge surfaces 43 thereof. In addition, the encapsulation 50 can be formed over side surfaces 33 of the microelectronic element 30 that extend between the bottom and top surfaces 31, 32. The encapsulation 50 can protect the microelectronic element 30 to avoid electrical short circuiting between the wire bonds 40, and to help avoid malfunction or possible damage due to unintended electrical contact between a wire bond and the microelectronic element.

The encapsulation 50 can allow for a more robust structure that is less likely to be damaged by testing thereof or during transportation or assembly to other microelectronic structures. The encapsulation 50 can be formed from a dielectric material with insulating properties such as that described in U.S. Patent Application Pub. No. 2010/0232129, which is hereby incorporated by reference herein.

In some embodiments, portions of the wire bonds 40 can remain uncovered by the encapsulation 50, which can also be referred to as unencapsulated portions 44, thereby making the wire bonds available for electrical connection to a conductive feature or element located above a portion of the encapsulation 50. In some embodiments, at least the tips 42 of the wire bonds 40 and optionally portions of the edge surfaces 43 can remain uncovered by the encapsulation 50, such as described in U.S. Patent Application Pub. No. 2013/0093087, which is hereby incorporated by reference herein. In other words, the encapsulation 50 can cover the entire microelectronic package 30 from the first surface 21 and above, with the exception of a portion of the wire bonds 40, such as the tips 42, portions of the edge surfaces 43, or combinations thereof.

The encapsulation can have an exposed major surface 51 that can define a top surface of the first microelectronic package 10. The encapsulation can have one or more shaped recesses 52 that can extend downward from the major surface 51 in the third direction D3 by a distance R, and the unencapsulated portions 44 of the wire bonds 40 can be exposed within the recesses 52. As shown in FIG. 1A, a particular first microelectronic package 10 can include recesses 52, 52a, 52b having different shapes from one another. The tips 42 of the wire bonds 40 and portions of the edge surfaces 43 can remain uncovered by the encapsulation 50.

The tips 42 of the wire bonds 40 can extend within the recesses 52 to a location below a plane P defined by the major surface 51 of the encapsulation 50. In other embodiments, the tips 42 of the wire bonds 40 may extend to a location at the plane P defined by the major surface 51 of the encapsulation, or the tips of the wire bonds may extend to a location above the plane P defined by the major surface of the encapsulation. The shaped recesses 52 can each define a respective inner surface 53, which is a surface of the encapsulation exposed within each respective shaped recess. Although FIG. 1A shows the tips 42 and portions of the edge surfaces 43 being exposed within each of the corresponding recesses, that need not always be the case. In one example, only the tips 42 of the wire bonds 40 may be exposed within the recesses 52 and may be uncovered by the encapsulation 50, while the entire length of the edge surfaces 43 may be in contact with the encapsulation.

As can be seen in FIG. 1A, one or more of the shaped recesses 52 can have an electrically conductive adhesion and/or electrically conductive barrier layer 54 deposited (e.g., by plating) onto the inner surface 53 of the encapsulation exposed within the respective recess, and deposited onto the tips 42 of the wire bonds 40 and the edge surfaces 43 of the wire bonds adjacent to the tips. The barrier layer 54 can comprise a diffusion barrier layer comprising, for example, one or more of nickel, gold, silver, and palladium.

It is desirable that the conductive barrier layer 54 only partially fill the volume within the shaped recesses 52, so that a portion of the corresponding joining units 13 may extend into the recesses and fill the remaining volume therein. In variations of all of the embodiments herein, an electrically conductive barrier layer such as the barrier layer 54 may be used with or without an electrically conductive adhesion layer, and alternatively, an electrically conductive adhesion layer may be used without an electrically conductive barrier layer. In such variations, the barrier layer 54 may be referring to at least one of an electrically conductive barrier layer and/or an electrically conductive adhesion layer.

Although the conductive barrier layer 54 is shown as coating the entire inner surface 53 of the encapsulation 50 exposed within the respective recess 52, that need not always be the case. In a particular example, the barrier layer 54 may only cover the unencapsulated portions 44 of the wire bonds 40. In another example, the barrier layer 54 may cover the unencapsulated portions 44 of the wire bonds 40 and a portion of the inner surface 53 of the encapsulation 50 within the recess 52, leaving another portion of the inner surface of the encapsulation within the recess uncovered by the barrier layer.

Although FIG. 1A shows the barrier layer 54 covering the tips 42 and portions of the edge surfaces 43 being exposed within each of the corresponding recesses 52, that need not always be the case. In one example, only the tips 42 of the wire bonds 40 may be exposed within the recesses 52 and may be covered by the barrier layer 54, while the entire length of the edge surfaces 43 may be in contact with the encapsulation and may not be covered by the barrier layer.

The presence of the conductive barrier layer 54 at the unencapsulated portion 44 of the wire bond 40 (e.g., the tips 42 of the wire bonds and the edge surfaces 43 of the wire bonds adjacent to the tips) can protect the tip of the wire bond from forming intermetallic compounds with the material of the joining unit 13, thereby preventing or reducing potential weakening of the structure of the tip of the wire bond that may result from forming such intermetallic compounds.

Such growth of intermetallic compounds at the tips 42 and/or the unencapsulated portions 44 of the sure bonds 40 can be a significant problem for BVA and BGA interconnects comprising wire bonds that are about 1 mil or less in diameter (about 25 microns or less). The structures described herein (e.g., the conductive barrier layer 54 or other barrier layers described below) can result in reduced stress at the BVA and BGA interconnection interface, which can reduce the metal crystal formation rate. Such structures also permit joining of microelectronic structures with a reduced joining unit size (e.g., the size of the joining units 13), which can reduce diffusion kinetics and the thickness of joined PoP structures.

In one embodiment, such as when the barrier layer 54 includes Nickel, the barrier layer may completely separate the material of the electrically conductive joining unit 13 from the inner surface 53 of the recess 52 and from the tip 42 of the wire bond 40, thereby preventing the formation of intermetallic compounds between the joining unit (e.g., comprising tin solder) and the wire bond (e.g., comprising copper). For example, in an embodiment in which the barrier layer 54 includes a layer of nickel overlying the unencapsulated portion 44 of the wire bond 40 and a layer of gold overlying the layer of nickel to prevent or minimize oxidation of the nickel, the nickel portion of the barrier layer may separate the joining unit 13 from the inner surface 53 of the recess 52 and from the unencapsulated portion of the wire bond (the gold layer may diffuse into the solder of the joining unit).

In an alternative embodiment, such as when the barrier layer 54 includes palladium, the barrier layer may completely diffuse into the material of the electrically conductive joining unit 13 (e.g., comprising tin solder), such that a layer of palladium in its original form will not separate material of the joining unit from inner surface 53 of the recess 52 and from the tip 42 of the wire bond 40 (e.g., comprising copper). In such an embodiment, intermetallic compounds of tin/copper/palladium would form around the unencapsulated portion 44 of the wire bond 40, and intermetallic compounds of tin/palladium would form at the inner surface 53 within the recess 52, so the original material of the joining unit 13 would not be fully separated from the inner surface of the recess or from the tip 42 or unencapsulated portion of the wire bond. However, the tin/copper/palladium and tin/palladium intermetallic compounds could together be described as an electrically conductive layer overlying the inner surface 53 of the encapsulation 50 exposed within the recess 52, the electrically conductive layer overlying and electrically connected with the tip 42 (and/or the unencapsulated portion 44) of the wire bond 40.

Compared to conventional structures, the shaped recesses of FIG. 1A can permit increased surface area of contact of a joining unit such as the solder ball 13 and the inner surface 53 of the encapsulation exposed within the shaped recess 52, and/or increased surface area of contact of a joining unit such as the solder ball 13 and a top surface 55 of the barrier layer 54 exposed within the shaped recess 52. The structure of the shaped recesses 52 with the tips 42 of the wire bonds 40 and portions of the joining units 13 therein can reduce stress experienced by the unencapsulated portions 44 of the wire bonds, for example, due to differential thermal expansion between the first and second microelectronic packages 10, 12 bonded together by the joining units. Such a reduced stress on the unencapsulated portions 44 of the wire bonds 40 can reduce cracking near the tip 42 of the wire bond and/or at the joint between the joining unit 13 and the corresponding conductive element 14 of the second microelectronic package 12, thereby improving reliability of the electrical connections between the joined first and second microelectronic packages 10, 12.

The shaped recesses 52 can aid in reliability of the bonds between the wire bonds 40 and the conductive elements 14 joined with the wire bonds via a joining material 13 such as solder. These shaped recesses 52 can also permit the wire bonds 40 of the first microelectronic package 10 to be joined with the conductive elements 14 of the second microelectronic package 12 with a decreased standoff distance between the confronting surfaces 51, 62 of the two microelectronic packages. The structures described herein (e.g., the shaped recesses 52) can result in reduced stress at the BVA and BGA interconnection interface. Such structures also permit joining of microelectronic structures with a reduced joining unit size (e.g., the size of the joining units 13), which can reduce diffusion kinetics and the thickness of joined microelectronic structures.

Figure 1B:
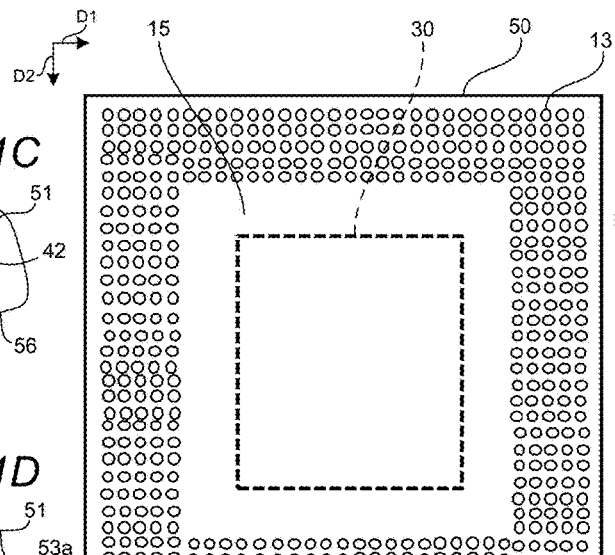
FIG. 1B illustrates a top view of the first microelectronic package of FIG. 1A.
Figure 1C:
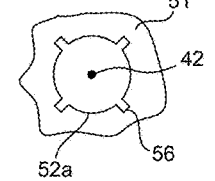
FIGS. 1C-1E illustrate partial top views of potential recess shapes extending into the major surface of the encapsulation of the first microelectronic package of FIG. 1A.

The shaped recess 52 can have various shapes, as illustrated in examples shown in FIGS. 1A, 1C, 1D, and 1E. In one embodiment, the shaped recesses 52 can have a shape that is a section of a sphere, such as the lower half of a sphere, for example. In a particular example shown on the left side of FIG. 1A and in FIG. 1C, a shaped recess 52a can have extended portions 56 that penetrate further into the encapsulation 50 at a significant angle beyond the smoothly-varying contour of the rest of the inner surface 53 of the recess. The shaped recess 52a has four extended portions 56 disposed at 90° intervals about a central axis A of the recess that extends parallel to the vertical direction D3. Although four extended portions are shown in FIG. 1C, the shaped recesses 52 can have any number of extended portions 56, the extended portions can extend from any portion of the inner surface 53 of the recess, and the extended portions can have any geometric distribution along the inner surface of the recess.

Although in FIG. 1A, the conductive barrier layer 54 is shown as extending within the extended portions 56 of the recess 52a, that need not always be the case. In one example, the conductive barrier layer 54 may only cover the unencapsulated portions 44 of the wire bonds 40, leaving the extended portions 56 uncovered by the barrier layer. In another example, the barrier layer 54 may cover the unencapsulated portions 44 of the wire bonds 40 and at least a part of one or more of the extended portions 56 of the recess 52, leaving other portions of the inner surface of the encapsulation within the recess uncovered by the barrier layer, and/or other parts of one or more of the extended portions of the recess uncovered by the barrier layer.

Figure 1D:
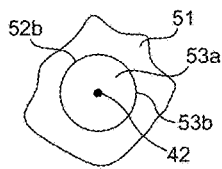

In another example shown on the left side of FIGS. 1A and 1n FIG. 1D, a shaped recess 52b can have a rectangular cross section, such as that shown in FIG. 1A. The shaped recess 52b can have a bottom surface 53a and a sidewall 53b, the sidewalls extending away from the bottom surface at a substantial angle. As shown in FIG. 1D, the sidewall 53b of the recess 52b may have a circular top view. In other embodiments, the top view of the sidewall 53b can have any other shape, such as an oval, ellipse, or another smoothly-varying curve, or other regular or irregular polygons, such as a square, rectangle, hexagon, octagon, or the like.

Figure 1E:
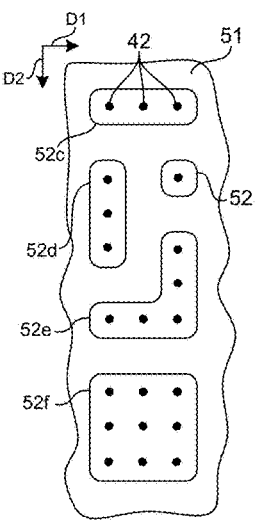

Although the example shaped recesses 52a and 52b shown in FIGS. 1C and 1D have a single unencapsulated portion 44 of a wire bond 40 exposed within each recess, that need not be the case. As can be seen in FIG. 1E, a single recess 52 may have a plurality of unencapsulated portions 44 of wire bonds 40 exposed therein or extending therethrough, and such recesses may have any shape. For example, the recess 52c has an oblong or channel shape having a long dimension extending in the lateral direction D1, and the recess has three unencapsulated portions 44 of wire bonds 40 exposed therein. In another example, the recess 52d has an oblong or channel shape having a long dimension extending in the lateral direction D2, and the recess has three unencapsulated portions 44 of wire bonds 40 exposed therein.

In yet another example, the recess 52e has an oblong or channel-shaped lobes, one lobe having a long dimension extending in the lateral direction D1, and another lobe having a long dimension extending in the lateral direction D1, and the recess has five unencapsulated portions 44 of wire bonds 40 exposed therein. In still another example, the recess 52f has a square shape, extending across a plurality of unencapsulated portions 44 of wire bonds 40 exposed therein in both the D1 and D2 lateral directions, such that the tips 42 of the wire bonds form a three-by-three array within a single recess. The invention contemplates other shapes of recesses 52 having any number of unencapsulated portions 44 of wire bonds 40 exposed therein in one or both of the D1 and D2 lateral directions.

FIG. 1B shows one exemplary configuration of upper terminals comprising solder balls or other joining units 13 exposed at the major surface 51 of the encapsulation 50 of the first microelectronic element 10, each joining unit being electrically connected with a corresponding one of the wire bonds 40. As can be seen in FIG. 1B, the upper terminals are disposed in an array having a plurality of terminals extending in each of the first and second lateral directions D1, D2. As shown, the upper terminals are generally disposed at the periphery of the major surface 51, and a central region 15 of the major surface overlying the microelectronic element 30 is depopulated (i.e., devoid of upper terminals). In other embodiments, the invention contemplates any configuration of upper terminals across the major surface 51 of the encapsulation 50, and the central region 15 may be populated or unpopulated by upper terminals.

The second microelectronic package 12 shown in FIG. 1A can have any structure. In the example shown, the second microelectronic package 12 has a substrate 60 having opposed first and second surfaces 61, 62. The second microelectronic package 12 has a microelectronic element 63 joined to the first surface 61 of the substrate 60 and electrically conductive elements 14 at the second surface 62. The second microelectronic package 12 has an encapsulation 64 overlying the first surface 61 and the microelectronic element 63.

Figure 2A:
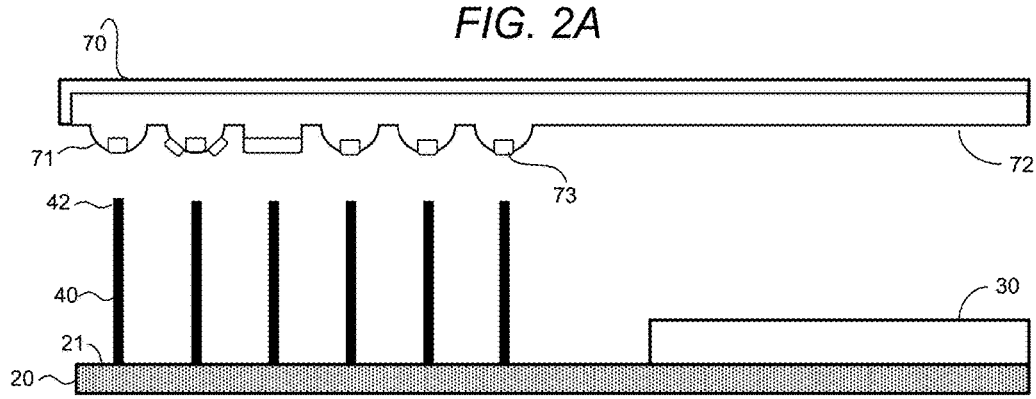
FIGS. 2A-2F illustrate partial side sectional views of in-process structures corresponding to stages of formation of the first microelectronic package of FIG. 1A.

A method of fabrication of the microelectronic assembly 5 of FIG. 1A will now be described in accordance with FIGS. 2A-2F. As can be seen in FIG. 2A, an exemplary mold frame 70 can be made with protrusions 71 having different shapes extending from its lower surface 72. As shown in FIG. 2A, a particular mold frame 70 can include protrusions 71 having different shapes from one another. Portions of the protrusions 71 that are intended to be placed over the tips 42 of the wire bonds 40 can be portions of a molding film 73 that are configured to be penetrated by the tips of the wire bonds. In one embodiment, the molding film 73 can be made from a water soluble plastic material such that it can be removed by exposure to water without affecting the other components of the in-process unit or the microelectronic package 10. In another embodiment, the molding film 70 can be removed from the encapsulation 50 (FIGS. 2C and 2D) after exposure to ultraviolet light. The conductive contacts 43 at the first surface 21 of the substrate 20, from which the wire bonds 40 extend, are not shown in FIGS. 2A-2F.

Figure 2B:
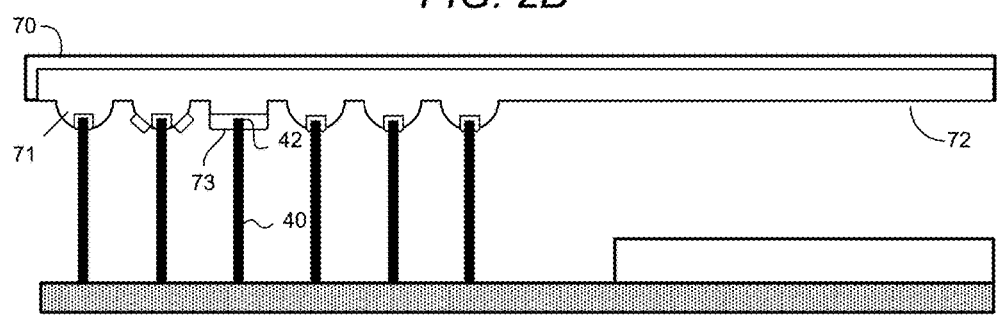
Figure 2C:
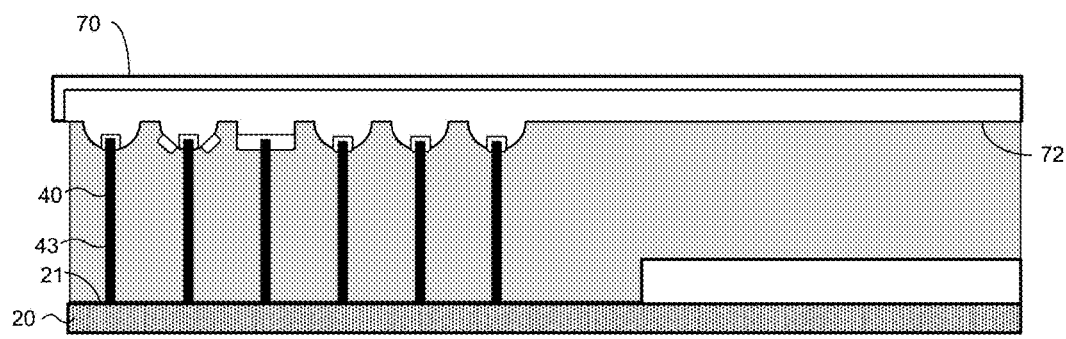

Referring to FIG. 2B, the protrusions 71 can be placed over the tips 42 of the wire bonds 40, to secure the locations of the wire bonds while the encapsulation 50 is formed (FIG. 2C). The mold frame 70 can be lowered onto the tips 42 of the wire bonds 40 extending from the first surface 21 of the substrate 20, such that the tips of the wire bonds that will later become the unencapsulated portions 44 penetrate into portions of the molding film 73. Then, as can be seen in FIG. 2C, the encapsulation 50 can be formed within the mold frame 70, surrounding the exposed edge portions 43 of the wire bonds 40 and filling the space between the first surface 21 of the substrate 20 and the lower surface 72 of the mold frame.

Figure 2D:
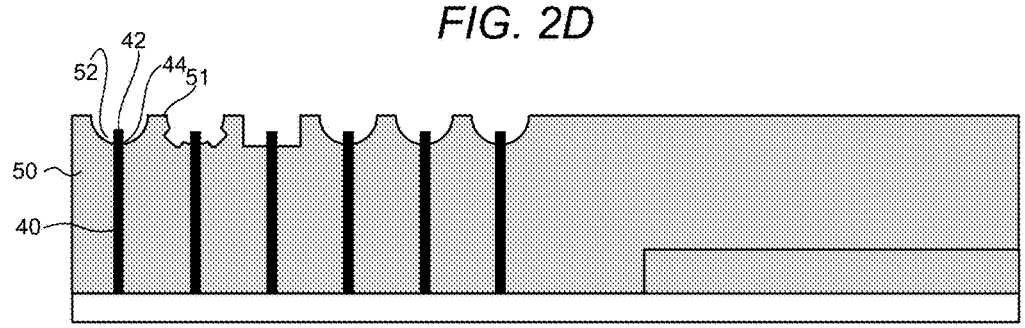

Then, referring to FIG. 2D, the mold frame 70 can be removed, leaving the recesses 52 extending below the major surface 51 of the encapsulation 50 at the location of the tips 42 of the wire bonds 40, with the unencapsulated portions 44 of the wire bonds disposed within the recesses. After the mold frame 70 is removed, the molding film 73 can be removed from the encapsulation 50, such as by applying a suitable chemical to detach or dissolve the molding film. After removal of the molding film 70, the unencapsulated portions 44 of the wire bonds 40 can remain uncovered by the encapsulation 50.

Figure 2E:
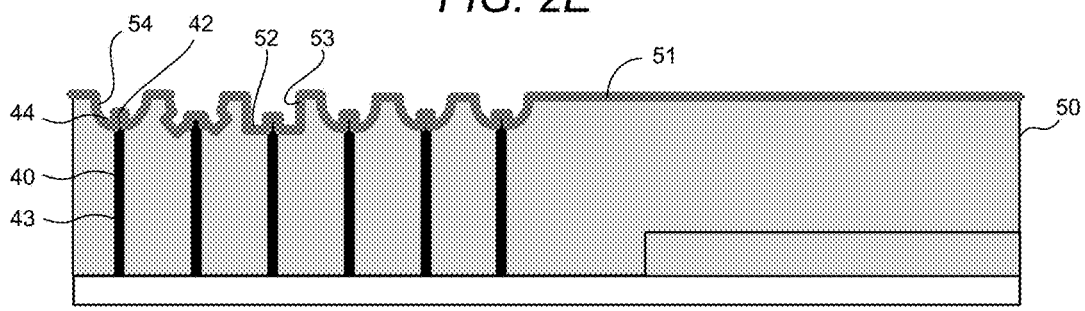

Next, referring to FIG. 2E, an electrically conductive adhesion material can be deposited within the recesses 52, and an electrically conductive barrier material can be deposited into the recesses, overlying the conductive adhesion material. Excess conductive adhesion and barrier material can be removed from portions of the major surface 51 of the encapsulation extending between adjacent ones of the recesses 52. Removal of the excess conductive adhesion and barrier material can leave behind a conductive adhesion and/or conductive barrier layer 54 deposited onto the inner surfaces 53 of the encapsulation 50 exposed within the shaped recesses 52, and deposited onto the unencapsulated portions 44 of the wire bonds 40 (i.e., the tips 42 of the wire bonds and the edge surfaces 43 of the wire bonds adjacent to the tips).

Figure 2F:
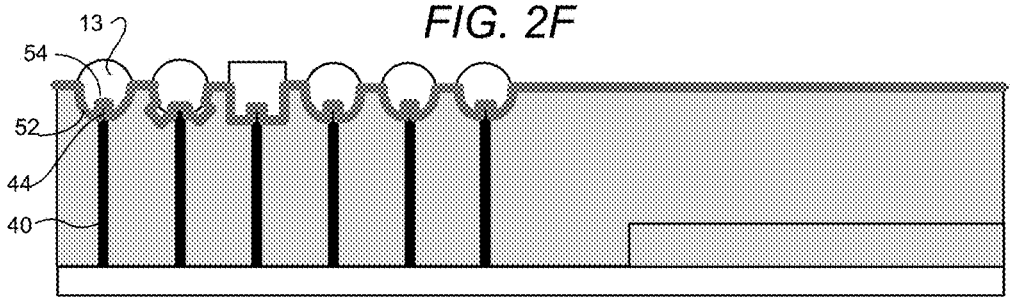

Then, referring to FIG. 2F, the joining units 13 (e.g., solder balls) can be deposited into the recesses 52 overlying the remaining portions of the conductive adhesion and/or barrier layer 54 and overlying the unencapsulated portions 44 of the wire bonds 40, which have been coated by the conductive adhesion and/or barrier layer. Next, referring again to FIG. 1A, the second microelectronic package 12 can be joined with the first microelectronic package 10 by joining the conductive elements 14 of the second microelectronic package with corresponding ones of the joining units 13.

Figure 3A:
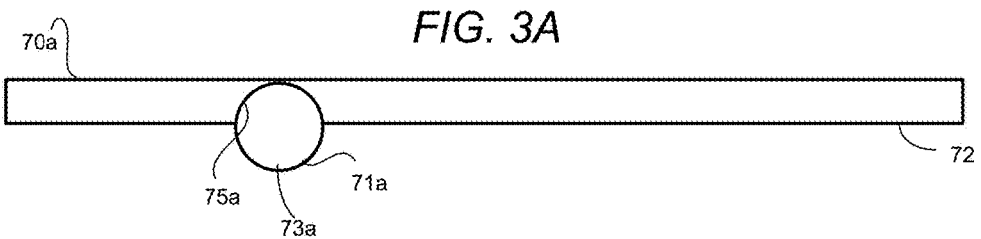
FIGS. 3A-3D illustrates side sectional views of various potential film and mold frame designs that can be used in place of the film or mold frame shown in FIGS. 2A-2C.

The design of the mold frame 70 and the molding film 73 can be replaced with any of the alternative designs shown and described with respect to FIGS. 3A-3D. For simplicity, only a single protrusion 71a-71d is shown in each of FIGS. 3A-3D, but the mold frames 70a-70d may include any number of protrusions. As shown in FIG. 3A, a mold frame 70a can have a plurality of protrusions 71a partially or entirely formed by material of the molding film 73a. Such protrusions 71a formed by material of the molding film 73a can be partially disposed in corresponding recesses 75a extending below the lower surface 72 of the mold frame 70a.

Figure 3B:
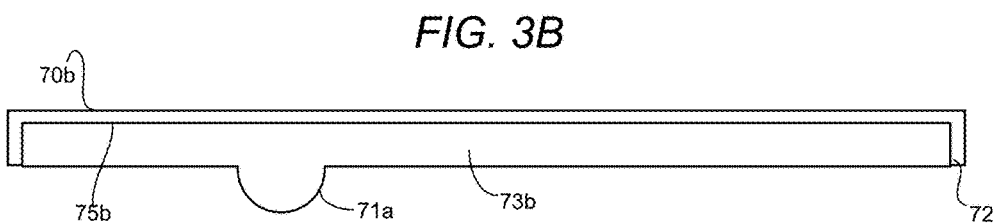
Figure 3C:
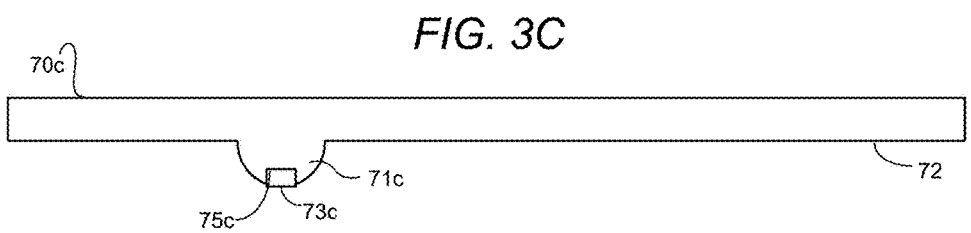

As shown in FIG. 3B, a mold frame 70b can have one or more regions each formed by material of the molding film 73b, each such region including one or more protrusions 71b. Such regions formed by material of the molding film 73b can be partially disposed in corresponding recesses 75b extending below the lower surface 72 of the mold frame 70a. Each of the regions formed by material of the molding film 73b can define corresponding portions of the lower surface 72 of the mold frame 70a. As shown in FIG. 3C, a mold frame 70c can have one or more protrusions 71c formed partially of the material of the mold frame and extending from the lower surface 72. Each of the protrusions 71c can have one or more portions thereof formed by material of the molding film 73c, each portion either extending from a surface of the respective protrusion or disposed at least partially in a recess 75c extending below a surface of the protrusion.

Figure 3D:
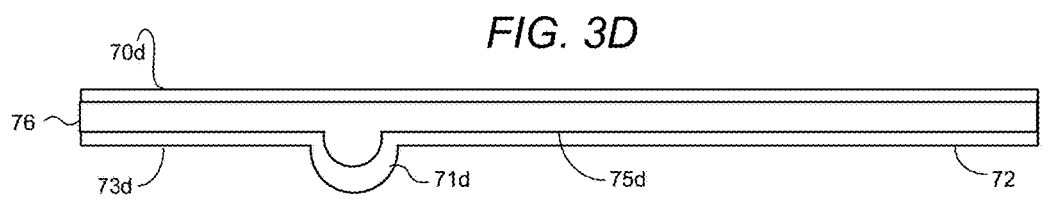

FIG. 3D shows a mold frame 70d that is a variant of the mold frame 70b of FIG. 3B. The mold frame 70d can have one or more regions each formed by material of the molding film 73d, each such region including one or more protrusions 71d. Each of the regions formed by material of the molding film 73d can define corresponding portions of the lower surface 72 of the mold frame 70d. Each region of the molding film 73d can have one or more cavities 75d therein that can be filled by a compliant material 76 having a Young's modulus lower than the Young's modulus of the material of the molding film. As shown in the example of FIG. 3D, one or more of the protrusions 71d can have a portion thereof formed by material of the molding film 73d, and a portion thereof formed by material of the compliant material 76.

Figure 4:
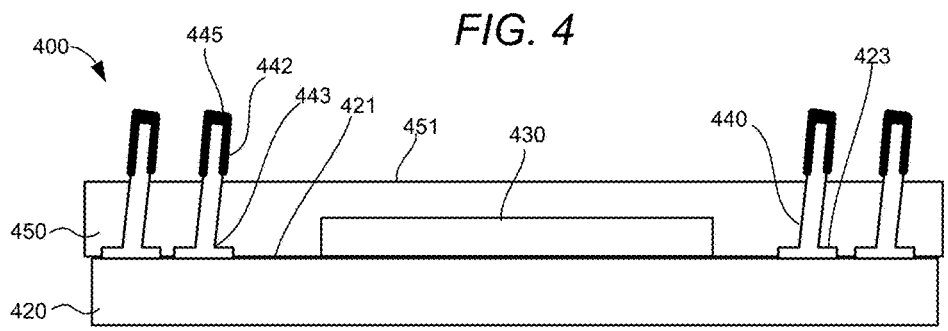
FIG. 4 illustrates exemplary wire bond structures having ends coated by a barrier metal layer, according to an embodiment of the invention.

FIG. 4 shows an exemplary microelectronic package 400 having a substrate 420, a microelectronic element 430 joined to a first surface 421 of the substrate, an encapsulation 450 overlying the first surface and the microelectronic element, and a plurality of wire bonds 440 extending away from electrically conductive contacts 423 through the encapsulation. The wire bonds 440 have unencapsulated portions 444 at the tips 442 and portions of the edge surfaces 443 adjacent the tips that are not covered by the encapsulation 450 and that extend above the major surface 451 of the encapsulation.

In this embodiment, the unencapsulated portions 444 of the wire bonds 440 are coated by a barrier layer 445 that can comprise a diffusion barrier layer comprising, for example, one or more of nickel, gold, and silver. Such a barrier layer 445 can prevent intermetallic structures from forming between the metal of the wire bonds 440 and the material of joining units such as solder balls. The barrier layer 445 can be, for example, an electrolytically coated barrier on exposed copper material of the wire bonds 440. Such a barrier layer 445 can be deposited onto the unencapsulated portions 444 or the entire edge surfaces 443 of any of the wire bonds of any of the embodiments described herein.

Figure 5:
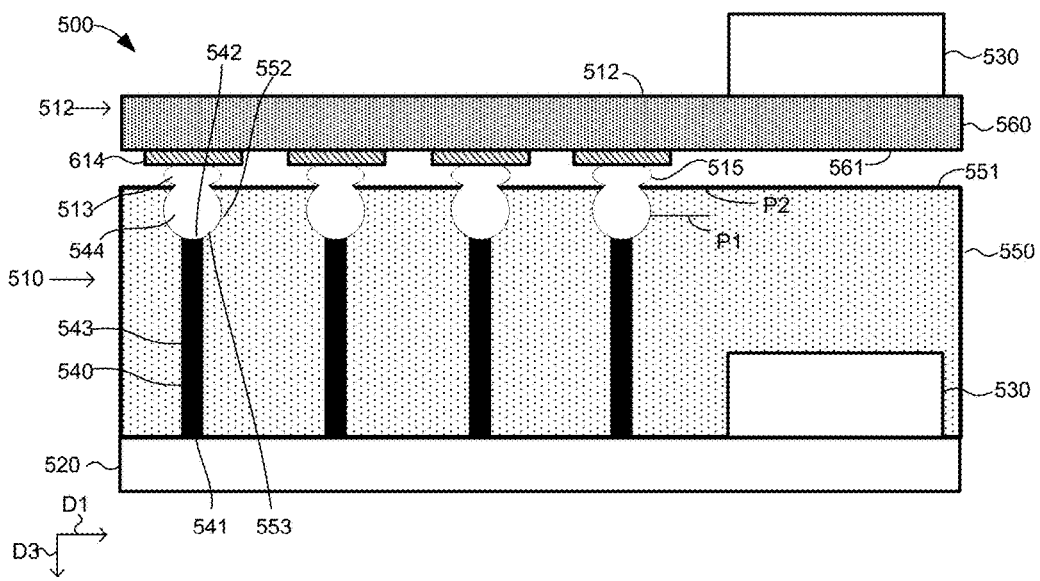
FIG. 5 illustrates a partial side sectional view of a microelectronic assembly including a first microelectronic package that can be formed using a wire bond interconnect process according to another embodiment of the invention, the wire bonds of the first microelectronic package electrically connected to corresponding conductive elements of a second microelectronic package.

FIG. 5 illustrates a particular type of microelectronic assembly 500 that is a variation of the microelectronic assembly 5 of FIG. 1A. All features and variations of the microelectronic assembly 500 are identical to those described above with reference to the microelectronic assembly 5, except as otherwise noted below. It should be understood that any features and variations described above with reference to the microelectronic assembly 5 can also be applied to and/or combined with the features of the microelectronic assembly 500.

The microelectronic assembly 500 can include a first microelectronic package 510 and a second microelectronic package 512 joined thereto. The microelectronic package 510 can include packaging structure, for example, a generally planar element in the form of a substrate 20 having a first surface 21 and a second surface 22 opposite the first surface. The microelectronic package 510 can include a microelectronic element 530 joined to the first surface 521 of the substrate 520. The microelectronic element 530 can be an active or passive microelectronic component.

The microelectronic package 510 can include a plurality of wire bonds 540 that can be joined with at least some electrically conductive contacts at the first surface 521 (not shown in FIG. 5 for simplicity). Each of the wire bonds 540 can be bonded at a base 541 thereof, such as a ball bond or a wedge bond, to a respective conductive contact at the first surface 521. Each of the wire bonds 540 can extend to a tip 542 remote from the base 541 of such wire bond and remote from the substrate 520, and can include an edge surface 543 extending from the tip 542 to the base 541.

The tips 542 of the wire bonds 540 can be available for electrical connection, either directly or indirectly as through a joining element 513, to conductive elements 514 of another component external to the first microelectronic package 510, shown in FIG. 5, for example, as the second microelectronic package 512. The tips 542 or the unencapsulated ends 544 of the wire bonds 540 and/or the joining elements 513 can therefore function as upper terminals of the first microelectronic package 510. The microelectronic package 510 can include an encapsulation 550 that can be formed extending between the individual wire bonds 540 and overlying the microelectronic element 530 and the first surface 521 of the substrate 520. The encapsulation can have an exposed major surface 551 that can define a top surface of the first microelectronic package 510.

In some embodiments, portions of the wire bonds 540 can remain uncovered by the encapsulation 550, which can also be referred to as unencapsulated portions 544, thereby making the wire bonds available for electrical connection to a conductive feature or element located above a portion of the encapsulation 550. In some embodiments, at least the tips 542 of the wire bonds 540 and optionally portions of the edge surfaces 543 can remain uncovered by the encapsulation 550. The encapsulation 550 can have one or more recesses 552 that can extend downward from the major surface 551 in the third direction D3, and the unencapsulated portions 544 of the wire bonds 540 can be exposed within the recesses.

As can be seen in FIG. 5, in some embodiments, each of the recesses 552 can define a maximum width (or maximum diameter) in the direction D1 in a plane P1 parallel to and below the major surface 551, and a surface width (or surface diameter) in a plane P2 coincident with the major surface, the maximum width (or maximum diameter) being greater than the surface width (or surface diameter). Likewise, in some embodiments, the portion of each of the joining units 513 extending within the recesses 552 can define a maximum width (or maximum diameter) in the direction D1 in the plane P1 parallel to and below the major surface 551, and a surface width (or surface diameter) in the plane P2 coincident with the major surface, the maximum width (or maximum diameter) being greater than the surface width (or surface diameter).

Figure 6A:
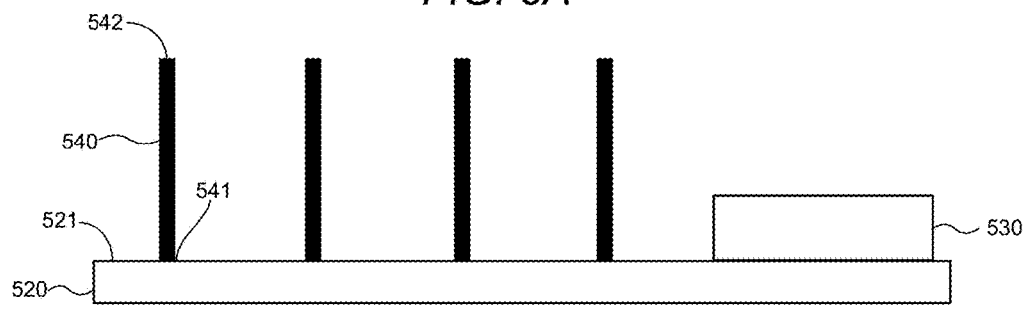
FIGS. 6A-6F illustrate partial side sectional views of in-process structures corresponding to stages of formation of the first microelectronic package of FIG. 1A.
Figure 6B:
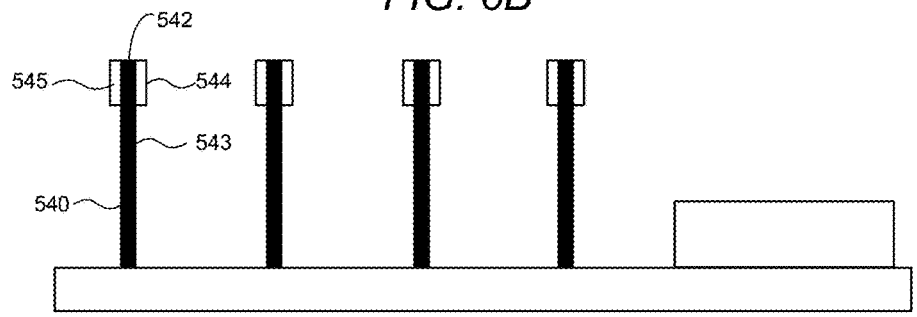

Similar to the wire bonds 440 of FIG. 4, the unencapsulated portions 544 of the wire bonds 540 of FIG. 5 can be coated by a barrier layer 545 (visible in FIG. 6B) that can comprise a diffusion barrier layer comprising, for example, one or more of nickel, gold, and silver. Such a barrier layer 545 can prevent intermetallic structures from forming between the metal of the wire bonds 540 and the material of the joining units 513. Such a barrier layer 545 can be deposited onto the unencapsulated portions 544 (as shown in FIG. 6B) or the entire edge surfaces 443 of any of the wire bonds of any of the embodiments described herein.

The second microelectronic package 512 shown in FIG. 5 can have any structure. In the example shown, the second microelectronic package 512 has a substrate 560 having opposed first and second surfaces 561, 562. The second microelectronic package 512 has a microelectronic element 563 joined to the first surface 561 of the substrate 560 and electrically conductive elements 514 at the second surface 562. The second microelectronic package 512 may also include an encapsulation (not shown in FIG. 5) overlying the first surface 561 and the microelectronic element 563.

A method of fabrication of the microelectronic assembly 500 of FIG. 5 will now be described in accordance with FIGS. 6A-6F. As can be seen in FIG. 6A, the substrate 520 has a plurality of wire bonds 540 extending from electrically conductive contacts (not shown) at the first surface 521 from bases 541 to tips 542 remote from the bases. One or more microelectronic elements 530 may optionally be provided and attached to the first surface 521 of the substrate 520. The substrate 520 can be a substrate, frame or film, and the substrate may include one or more active or passive microelectronic components therein.

Next, referring to FIG. 6B, the tips 542 and edge surfaces 543 of the wire bonds 540 adjacent to the tips (which will later become the unencapsulated portions 544) can be coated by a barrier layer 545 that can comprise a diffusion barrier layer comprising, for example, one or more of nickel, gold, and silver. In one example, the barrier layer 545 can be an electroless nickel immersion gold ("ENIG") coating.

Figure 6C:
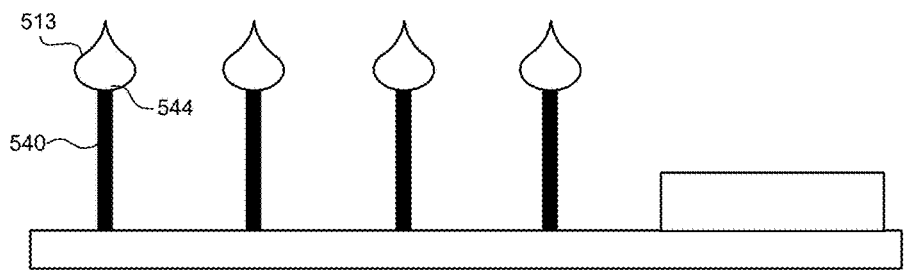

Then, referring to FIG. 6C, the tips 542 and edge surfaces 543 of the wire bonds 540 adjacent to the tips (which will later become the unencapsulated portions 544) can have the joining units 513 applied thereto, overlying the barrier layer 545. In one example, the in-process assembly can be inverted, and the tips 542 and edge surfaces 543 of the wire bonds 540 adjacent to the tips can be dipped into a liquid solder bath and then removed, leaving behind solder balls 513 overlying the barrier layer 545.

Figure 6D:
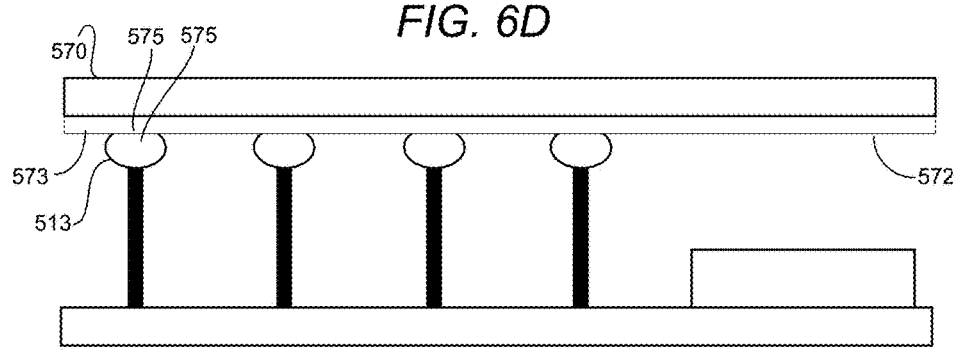
Figure 6E:
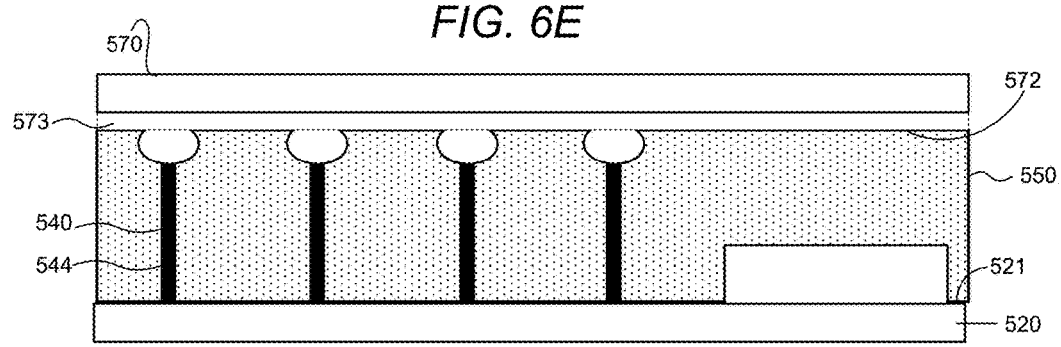

Next, referring to FIG. 6D, the in-process assembly can be inverted again and placed into a molding chamber. A mold frame 570 having a molding film 573 defining the lower surface 572 of the mold frame can be lowered onto the in-process assembly, with tips 515 of the joining units 513 at least partially penetrating into portions of the molding film, thereby creating recesses 575 extending below the lower surface 572. Then, as can be seen in FIG. 6E, the encapsulation 550 can be formed within the mold frame 570, surrounding the exposed edge portions 543 of the wire bonds 540 and filling the space between the first surface 521 of the substrate 520 and the lower surface 572 of the mold frame.

Figure 6F:
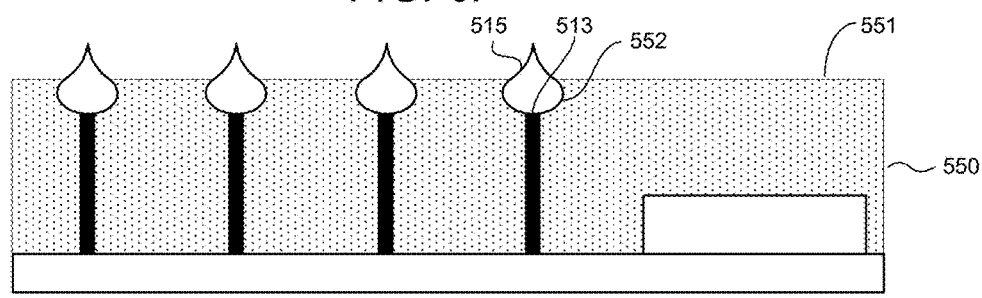

Then, referring to FIG. 6F, the mold frame 570 can be removed, leaving the recesses 552 extending below the major surface 551 of the encapsulation 550 at the location of the joining units 513, with the unencapsulated portions or tips 515 of the joining units extending out of the recesses above the major surface 551. The tips 515 of the joining units 513 are exposed at the major surface 551 of the encapsulation 550 after the molding is completed. At this point, the tips 542 of the wire bonds 540 and portions of the edge surfaces 543 adjacent to the tips are unencapsulated portions 544 that are surrounded by the solder 513 and not contacted by the encapsulation 550. After the mold frame 570 is removed, the molding film 573 can be removed from the encapsulation 550, such as by applying a suitable chemical to detach or dissolve the molding film. Next, referring again to FIG. 5, the second microelectronic package 512 can be joined with the first microelectronic package 510 by joining the conductive elements 514 of the second microelectronic package with tips 515 of corresponding ones of the joining units 513.

Similar to the embodiment of FIG. 1A, the ends 542 of the wire bonds 540 and portions of the joining units 513 can be disposed within shaped recesses 552 extending into the encapsulation. The resulting structure of the two joined microelectronic packages can have a reduced standoff height between confronting surfaces of the two joined microelectronic packages 510, 512. Other advantages such as those described above with reference to FIG. 1A can also be realized by the structure produced by the process of FIGS. 6A-6F, such as increased surface area of contact of a joining unit 513 such as a solder ball and the inner surface 553 of the encapsulation 550 exposed within the shaped recess 552, and reduced stress experienced by the tips 542 of the wire bonds, for example, due to differential thermal expansion between the two microelectronic packages 510, 512 bonded by the joining units.

The presence of the conductive barrier layer 545 (FIG. 6B) at the tip of the wire bond (e.g., the tip surfaces 542 of the wire bonds 540 and the edge surfaces 543 of the wire bonds adjacent to the tips) can protect the tips of the wire bond from forming intermetallic compounds with the material of the joining unit 513, thereby preventing weakening of the structure of the tip of the wire bond that may result from forming such intermetallic compounds. The reduced stress on the tips 542 and/or unencapsulated portions 544 of the wire bonds 540 and the reduction in formation of intermetallic compounds between the wire bonds and the joining units 513 can result in increased reliability of the electrical connections between the joined microelectronic packages 510, 512. Also, the structure produced by the process of FIGS. 6A-6F can accomplish joining of the two microelectronic packages with less solder volume and with a smaller pitch (distance between centers of adjacent ones of the wire bonds 540) compared to conventional BVA structures.

Figure 7:
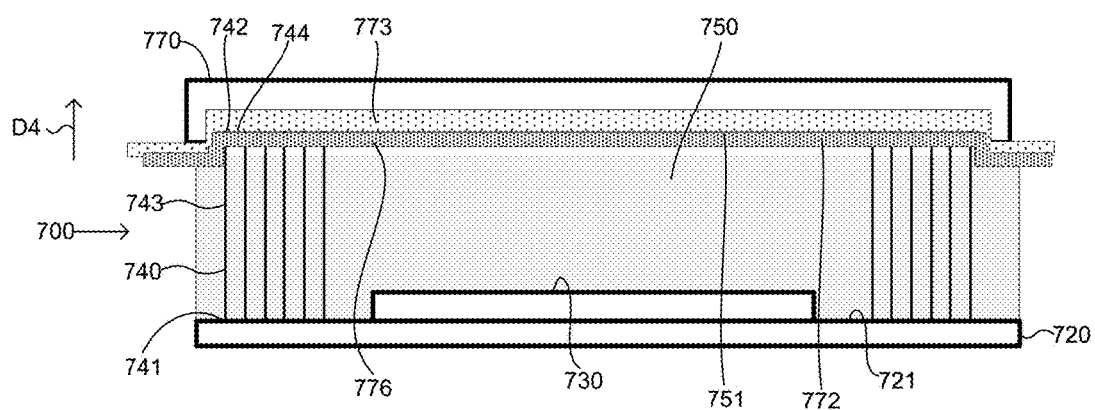
FIG. 7 illustrates a side sectional view of a variation of an in-process structure corresponding to one of the middle stages of the interconnect processes shown in FIGS. 2A-2F, the structure having a compliant layer disposed between the film and/or mold frame and the encapsulation.

FIG. 7 shows an exemplary in-process microelectronic package 700 having a substrate 720, a microelectronic element 730 joined to a first surface 721 of the substrate, an encapsulation 750 overlying the first surface and the microelectronic element, and a plurality of wire bonds 740 extending from bases 741 joined to electrically conductive contacts (not shown) at the first surface to tips 742 remote therefrom, through the encapsulation. The wire bonds 740 have unencapsulated portions 744 at the tips 742 and portions of the edge surfaces 743 adjacent the tips that are not covered by the encapsulation 750 and that extend above the major surface 751 of the encapsulation.

The in-process microelectronic package 700 is shown in a mold frame 770 that is a variant of the mold frames 70a-d of FIGS. 3A-3D. The mold frame 770 can have one or more regions each formed by material of the molding film 773, and layer 776 made of a compliant material having a Young's modulus lower than the Young's modulus of the material of the encapsulation 750. The compliant layer 776 defines the lower surface 772 of the mold frame 770. Similar to the methods described above with reference to FIGS. 2A-2F and 6A-6F, the mold frame 770 is lowered onto the tips 742 of the wire bonds 740, so that the tips of the wire bonds penetrate completely through the complaint layer 776 in the direction D4 and into the molding film 773.

After the encapsulation 750 is formed between the lower surface 772 of the mold frame 770 and the first surface 721 of the substrate, the mold frame 770 can be removed, leaving both the compliant layer 776 and the molding film 773 overlying the major surface 751 of the encapsulation 750. After the mold frame 770 is removed, the molding film 773 can be removed from the encapsulation 750, such as by applying a suitable chemical to detach or dissolve the molding film. After removal of the molding film 773, the compliant layer 776 remains in the microelectronic package 700, in contact with and overlying the first surface 551 of the encapsulation.

The unencapsulated portions 744 of the wire bonds 740 can remain uncovered by both the encapsulation 750 and the compliant layer 776. Such a compliant layer 776 can help distribute stress (e.g., from differential thermal expansion of the microelectronic package 700 relative to an external component) across among the wire bonds, so that once the unencapsulated portions 744 of the wire bonds 740 are joined with corresponding conductive contacts of an external component by joining units (e.g., solder balls) there will be a reduced chance of the wire bonds cracking at the locations of the unencapsulated portions. Any of the features of the embodiment of FIG. 7, e.g., depositing a compliant layer 776 onto the major surface of the encapsulation to distribute stress among the wire bonds, can be incorporated into any of the microelectronic package embodiments described above (e.g., FIGS. 1A, 4, 5).

Figure 8:
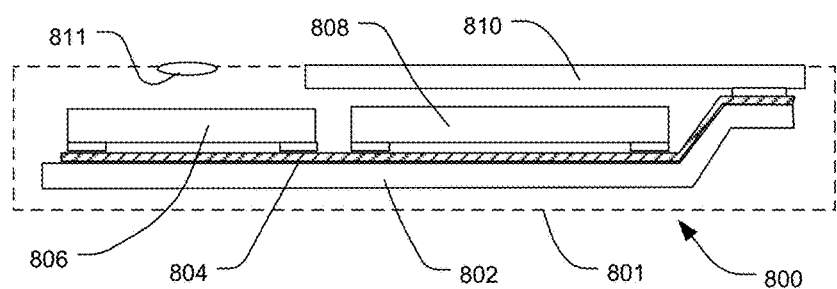
FIG. 8 is a schematic depiction of a system according to one embodiment of the invention.

The microelectronic packages, circuit panels, and microelectronic assemblies described above with reference to FIGS. 1A through 7 above can be utilized in construction of diverse electronic systems, such as the system 800 shown in FIG. 8. For example, the system 800 in accordance with a further embodiment of the invention includes a plurality of modules or components 806 such as the packages, circuit panels, and assemblies as described above, in conjunction with other electronic components 808, 810 and 811.

In the exemplary system 800 shown, the system can include a circuit panel, motherboard, or riser panel 802 such as a flexible printed circuit board, and the circuit panel can include numerous conductors 804, of which only one is depicted in FIG. 8, interconnecting the modules or components 806, 808, 810 with one another. Such a circuit panel 802 can transport signals to and from each of the microelectronic packages and/or microelectronic assemblies included in the system 800. However, this is merely exemplary; any suitable structure for making electrical connections between the modules or components 806 can be used.

In a particular embodiment, the system 800 can also include a processor such as the semiconductor chip 808, such that each module or component 806 can be configured to transfer a number N of data bits in parallel in a clock cycle, and the processor can be configured to transfer a number M of data bits in parallel in a clock cycle, M being greater than or equal to N. In the example depicted in FIG. 8, the component 808 is a semiconductor chip and component 810 is a display screen, but any other components can be used in the system 800. Of course, although only two additional components 808 and 811 are depicted in FIG. 8 for clarity of illustration, the system 800 can include any number of such components.

Modules or components 806 and components 808 and 811 can be mounted in a common housing 801, schematically depicted in broken lines, and can be electrically interconnected with one another as necessary to form the desired circuit. The housing 801 is depicted as a portable housing of the type usable, for example, in a cellular telephone or personal digital assistant, and screen 810 can be exposed at the surface of the housing. In embodiments where a structure 806 includes a light-sensitive element such as an imaging chip, a lens 811 or other optical device also can be provided for routing light to the structure. Again, the simplified system shown in FIG. 8 is merely exemplary; other systems, including systems commonly regarded as fixed structures, such as desktop computers, routers and the like can be made using the structures discussed above.

It will be appreciated that the various dependent claims and the features set forth therein can be combined in different ways than presented in the initial claims. It will also be appreciated that the features described in connection with individual embodiments may be shared with others of the described embodiments.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic package, comprising:
a substrate having a first surface and a second surface opposite therefrom and having first conductive elements at the first surface;
a plurality of wire bonds each having a base electrically connected to a corresponding one of the first conductive elements, a tip remote from the base corresponding thereto, and an edge surface extending between the tip and the base corresponding thereto;
an encapsulation having a major surface facing away from the first surface of the substrate, the encapsulation having defined therein a plurality of recesses extending from the major surface in a direction toward the first surface of the substrate;
the plurality of recesses in the encapsulation layer each including a plurality of extended portions extending into the encapsulation layer and spaced apart from one another at an interval;
tips of the plurality of wire bonds being disposed within the plurality of recesses;
an electrically conductive barrier layer overlying at least a portion of an inner surface of the encapsulation defined by the plurality of recesses including the plurality of extended portions for partially filling thereof and overlying the tips of the plurality of wire bonds, wherein the electrically conductive barrier layer provides barrier and adhesion properties in a single layer with only the single layer between the encapsulation and the plurality of wire bonds; and
joining units at least partially extending within the plurality of recesses, the joining units respectively filling remaining volumes of the plurality of recesses for electrical conductivity between the plurality of wire bonds and the second conductive elements, wherein the joining units are interconnected to the at least the portion of the inner surface of the plurality of recesses and the tips of the wire bonds responsive to intermetallic compounds formed between the joining units and the electrically conductive barrier layer for electrical conductivity between the joining units and the tips.

2. The microelectronic package of claim 1, wherein a portion of the edge surface-adjacent to the tip corresponding thereto is disposed within a recess of the plurality of recesses with the electrically conductive barrier layer overlying the portion of the edge surface.

3. The microelectronic package of claim 1, wherein the plurality of recesses of the encapsulation defining the inner surface provide a contour with the extended portions thereof penetrating into the encapsulation layer at a 90 degree angle relative to a portion of the contour of the inner surface closer to the major surface.

4. The microelectronic package of claim 1, wherein the tips of the plurality of wire bonds are respectively disposed within the plurality of recesses except for at least two tips thereof being disposed within a same one of the plurality of recesses.

5. The microelectronic package of claim 4, wherein the electrically conductive barrier layer overlies the at least two tips for electrical conductivity therebetween.

6. The microelectronic package of claim 1, further comprising a microelectronic element joined to the first surface of the substrate, the microelectronic element having a top surface facing away from the first surface of the substrate, wherein the major surface of the encapsulation overlies a top surface of the microelectronic element.

7. A microelectronic assembly, comprising:
the microelectronic package of claim 1, wherein the microelectronic package is a first microelectronic package having a first substrate and first conductive elements at the first surface thereof; and
a second microelectronic package having a second substrate and second conductive elements at a surface thereof.

\* \* \* \* \*